(12) United States Patent
Yanagita et al.

(10) Patent No.: US 9,508,770 B2
(45) Date of Patent: Nov. 29, 2016

(54) SOLID-STATE IMAGING DEVICE AND ELECTRONIC APPARATUS

(71) Applicant: Sony Corporation, Tokyo (JP)

(72) Inventors: Takeshi Yanagita, Tokyo (JP); Keiji Mabuchi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/414,710

(22) PCT Filed: Jul. 8, 2013

(86) PCT No.: PCT/JP2013/004216
§ 371 (c)(1),
(2) Date: Jan. 14, 2015

(87) PCT Pub. No.: WO2014/013696
PCT Pub. Date: Jan. 23, 2014

(65) Prior Publication Data
US 2015/0179691 A1    Jun. 25, 2015

(30) Foreign Application Priority Data

Jul. 18, 2012  (JP) ................................. 2012-159789

(51) Int. Cl.
*H01L 31/062* (2012.01)
*H01L 27/146* (2006.01)

(52) U.S. Cl.
CPC ..... *H01L 27/14634* (2013.01); *H01L 27/1464* (2013.01); *H01L 27/1469* (2013.01);
(Continued)

(58) Field of Classification Search
CPC .................. H01L 27/14634; H01L 27/14636; H01L 27/1464

USPC ................. 257/184, 291–293, 440, 444–448
See application file for complete search history.

(56) References Cited

U.S. PATENT DOCUMENTS 5,309,001 A * 5/1994 Watanabe ............. H01L 33/385
257/778
5,698,865 A * 12/1997 Gerner .................... H01L 33/38
257/103

(Continued)

FOREIGN PATENT DOCUMENTS

JP    H01-228202 A    9/1989
JP    2004-095916 A    3/2004

(Continued)

OTHER PUBLICATIONS

International Search Report; International Application No. PCT/JP2013/004216; Filed: Jul. 8, 2013. (Form PCT/ISA/210).

(Continued)

*Primary Examiner* — Ori Nadav
(74) *Attorney, Agent, or Firm* — Michael Best & Friedrich LLP

(57) ABSTRACT

A solid-state imaging device and method of making a solid-state imaging device are described herein. By way of example, the solid-state imaging device includes a first wiring layer formed on a sensor substrate and a second wiring layer formed on a circuit substrate. The sensor substrate is coupled to the circuit substrate, the first wiring layer and the second wiring layer being positioned between the sensor substrate and the circuit substrate. A first electrode is formed on a surface of the first wiring layer, and a second electrode is formed on a surface of the second wiring layer. The first electrode is in electrical contact with the second electrode.

31 Claims, 22 Drawing Sheets

(52) U.S. Cl.
CPC ... *H01L27/14612* (2013.01); *H01L 27/14636* (2013.01); *H01L 27/14641* (2013.01); *H01L 27/14643* (2013.01); *H01L 27/14689* (2013.01)

(56) References Cited

U.S. PATENT DOCUMENTS

| | | | | |
|---|---|---|---|---|
| 7,439,550 | B2* | 10/2008 | Tomioka | H01L 24/05 257/91 |
| 7,482,646 | B2* | 1/2009 | Gao | H01L 27/14636 257/292 |
| 8,570,409 | B2* | 10/2013 | Choi | H01L 27/14632 348/294 |
| 8,878,267 | B2* | 11/2014 | Inui | H01L 27/14609 257/184 |
| 9,142,587 | B2* | 9/2015 | Kobayashi | H01L 27/14632 |
| 9,196,643 | B2* | 11/2015 | Shimotsusa | H01L 27/14634 |
| 2005/0035381 | A1* | 2/2005 | Holm | H01L 27/1463 257/290 |
| 2007/0069258 | A1 | 3/2007 | Ahn | |
| 2008/0083939 | A1 | 4/2008 | Guidash | |
| 2010/0060764 | A1* | 3/2010 | McCarten | H01L 27/14641 348/308 |
| 2010/0097514 | A1* | 4/2010 | McCarten | H01L 27/14634 348/340 |
| 2010/0238331 | A1* | 9/2010 | Umebayashi | H01L 27/14632 348/294 |
| 2011/0156197 | A1 | 6/2011 | Tivarus et al. | |

FOREIGN PATENT DOCUMENTS

| | | |
|---|---|---|
| JP | 2006-100301 A | 4/2006 |
| JP | 2010-506404 A | 2/2010 |
| JP | 2010-165854 A | 7/2010 |
| JP | 2011-517506 | 6/2011 |
| JP | 2012-015400 A | 1/2012 |
| WO | WO-2008/117956 A1 | 10/2008 |
| WO | WO-2012/001939 A1 | 1/2012 |

OTHER PUBLICATIONS

PCT Written Opinion of the International Searching Authority; International Application No. PCT/JP2013/004216; Date of Opinion: Sep. 13, 2013. (Form PCT/ISA/220 and PCT/ISA/237).

European Communication Pursuant to Article 94(3) EPC issued Mar. 16, 2016 for corresponding European Application No. 13 739 826.9.

Japanese Office Action issued Jun. 28, 2016 for corresponding Japanese Application No. 2012-159789.

* cited by examiner

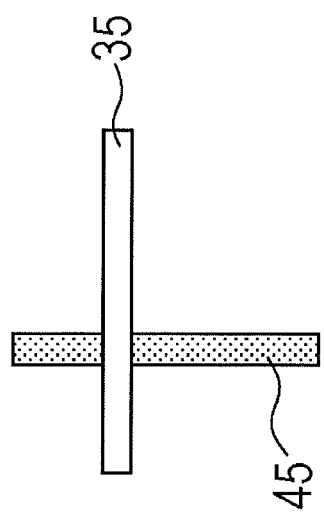

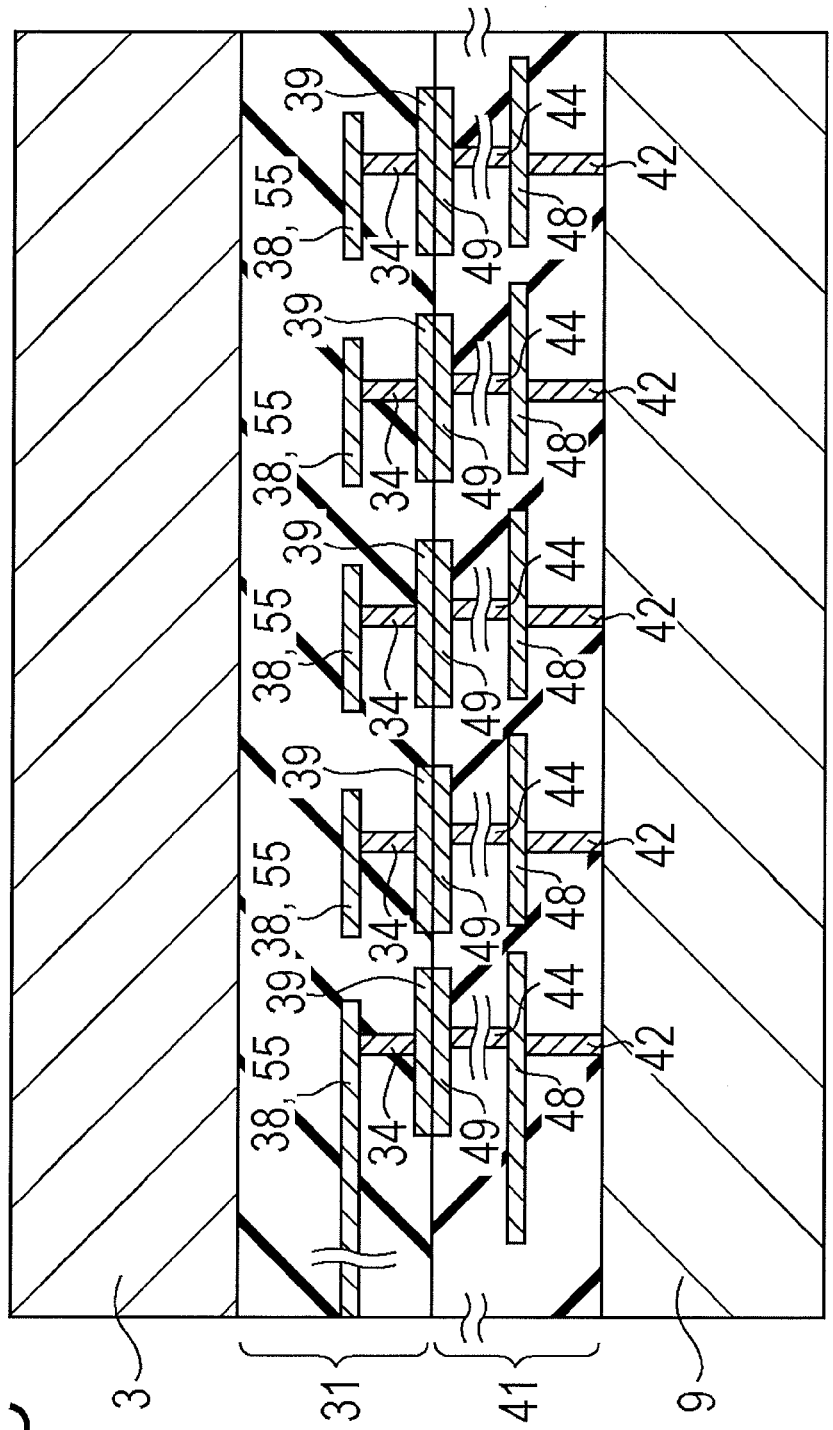

SOLID-STATE IMAGING DEVICE AND ELECTRONIC APPARATUS

TECHNICAL FIELD

The present disclosure relates to a back-side illumination type solid-state imaging device and an electronic apparatus having the solid-state imaging device.

BACKGROUND ART

In a solid-state imaging device while aiming to improve photoelectric conversion efficiency or sensitivity of incident light, a so-called back-side illumination type structure in which a drive circuit is formed on a surface side of a semiconductor substrate and a back surface side is a light receiving surface has been proposed. In addition, separately from the semiconductor substrate in which a photoelectric conversion element is formed, a three-dimensional (3D) structure in which a circuit substrate with a drive circuit formed thereon is prepared and bonded to a surface opposite to the light receiving surface of the semiconductor substrate has been also proposed. For example, a configuration in which a photodiode (PD), a floating diffusion (FD), and a pixel transistor other than a transfer gate and a transfer transistor are formed on mutually different substrates, and the substrates are bonded with each other has been proposed (For example, see PTL 1).

CITATION LIST

Patent Literature

PTL 1: Japanese Unexamined Patent Application Publication (Translation of PCT Application) No. 2011-517506

SUMMARY OF INVENTION

Technical Problem

In the back-side illumination type solid-state imaging device having the above-described configuration in which the substrates are bonded with each other, there is a demand for improving reliability of the solid-state device by improving joining reliability between the substrates.

It is desirable to provide a solid-state imaging device and an electronic apparatus that may improve reliability.

Solution to Problem

A solid-state imaging device and method of making a solid-state imaging device are described herein. By way of example, the solid-state imaging device includes a first wiring layer formed on a sensor substrate and a second wiring layer formed on a circuit substrate. The sensor substrate is coupled to the circuit substrate, the first wiring layer and the second wiring layer being positioned between the sensor substrate and the circuit substrate. A first electrode is formed on a surface of the first wiring layer, and a second electrode is formed on a surface of the second wiring layer. The first electrode is in electrical contact with the second electrode.

Further by way of example, the method for making a solid-state imaging device includes forming a first wiring layer on a sensor substrate, forming a second wiring layer on a circuit substrate, forming a first electrode on a surface of the first wiring layer, forming a second electrode on a surface of the second wiring layer, and coupling the sensor substrate to the circuit substrate with the first wiring layer and the second wiring layer being between the sensor substrate and the circuit substrate.

According to the above-described solid-state imaging device, the photodiode and the floating diffusion are formed on the first semiconductor substrate, and the second transistor is formed on the second semiconductor substrate. The floating diffusion wirings that connect the second transistor from the floating diffusion are connected by the first electrode and the second electrode. In this manner, in the floating diffusion wiring, a connection surface between the first semiconductor substrate and the second semiconductor substrate is joined with the first electrode and the second electrode, and therefore joining reliability of wiring and joining reliability between the substrates are improved. Accordingly, reliability of the solid-state imaging device and the electronic apparatus having the solid-state imaging device may be improved.

Advantageous Effects of the Invention

According to the present disclosure, it is possible to improve reliability of a solid-state imaging device and an electronic apparatus.

BRIEF DESCRIPTION OF DRAWINGS

FIG. 4A is a diagram showing a configuration of a first electrode and a second electrode.

FIG. 6C is a cross-sectional diagram of GND/TRG wirings around the pixel area shown in FIG. 6A.

DESCRIPTION OF EMBODIMENTS

Hereinafter, preferred embodiments of the present disclosure will be described, but are not limited to the following examples.

The description will be made in the following order.
1. First embodiment (solid-state imaging device)
2. Second embodiment (solid-state imaging device)
3. Third embodiment (solid-state imaging device)
4. Fourth embodiment (electronic apparatus)
<First Embodiment>
<Schematic Configuration Example of Solid-State Imaging Device>

Figure 1:
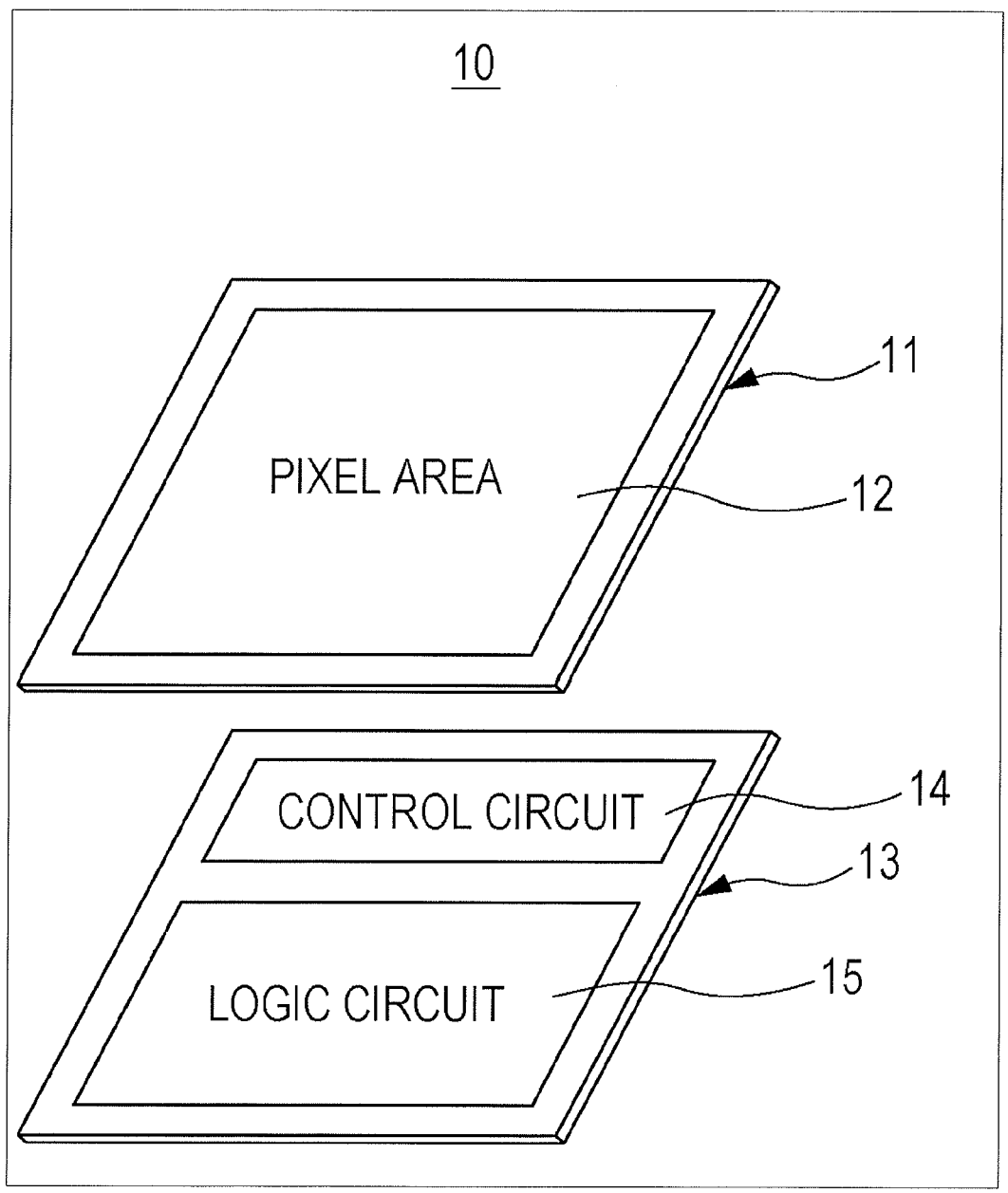
FIG. 1 is a schematic configuration diagram showing an example of a solid-state imaging device to which the present disclosure is applied.

In FIG. 1, a schematic configuration of a back-side illumination type solid-state imaging device to which the present disclosure is applied is shown. The solid-state imaging device 10 according to the present embodiment mounts a pixel area 12 in a first semiconductor chip unit 11 as shown in FIG. 1. In addition, the solid-state imaging device 10 mounts a control circuit 14 and a logic circuit 15 including a signal processing circuit in a second semiconductor chip unit 13. The first semiconductor chip unit 11 and the second semiconductor chip unit 13 are electrically connected with each other to be used as a single semiconductor chip, which constitute the MOS type solid-state imaging device 10.

<Pixel Unit Structure: Planar Arrangement>

Figure 2:
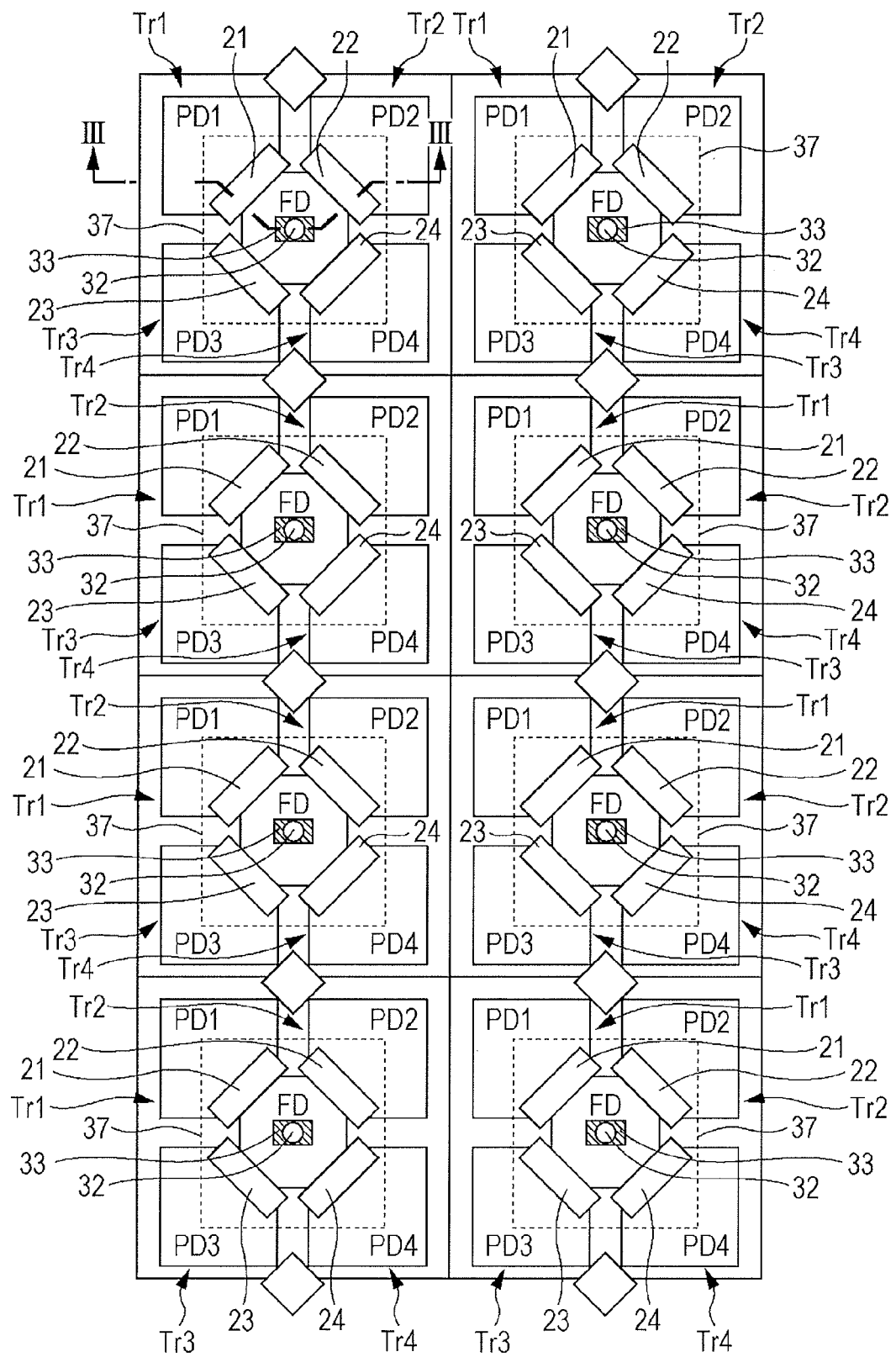
FIG. 2 is a diagram showing a planar arrangement of a pixel unit including a four-pixel sharing unit of a solid-state imaging device according to a first embodiment of the present disclosure.

Next, a configuration of a pixel unit of the solid-state imaging device of the present embodiment will be described. In FIG. 2, a planar arrangement of a pixel unit including a four-pixel sharing unit applied to the present embodiment is shown. As shown in FIG. 2, the four-pixel sharing unit in which photodiodes PD (PD1 to PD4) of four pixels are arranged is arranged in a two-dimensional array shape to thereby form the pixel unit.

The four-pixel sharing unit is a configuration in which a single floating diffusion FD is shared with respect to a total of four photodiodes PD1 to PD4 of lateral 2*longitudinal 2. In addition, the four-pixel sharing unit includes the four photodiodes PD1 to PD4, four transfer gate electrodes 21 to 24 with respect to the four photodiodes PD1 to PD4, and a single floating diffusion FD.

Transfer transistors Tr1 to Tr4 are configured by each of the photodiodes PD1 to PD4, the floating diffusion FD, and each of the transfer gate electrodes 21 to 24. The floating diffusion FD is disposed in a center portion surrounded by the four photodiodes PD1 to PD4, and each of the transfer gate electrodes 21 to 24 is disposed in a position corresponding to a corner on a center portion side of each of the photodiodes PD1 to PD4.

<Pixel Unit Structure: Cross-Sectional Configuration>

Figure 3:
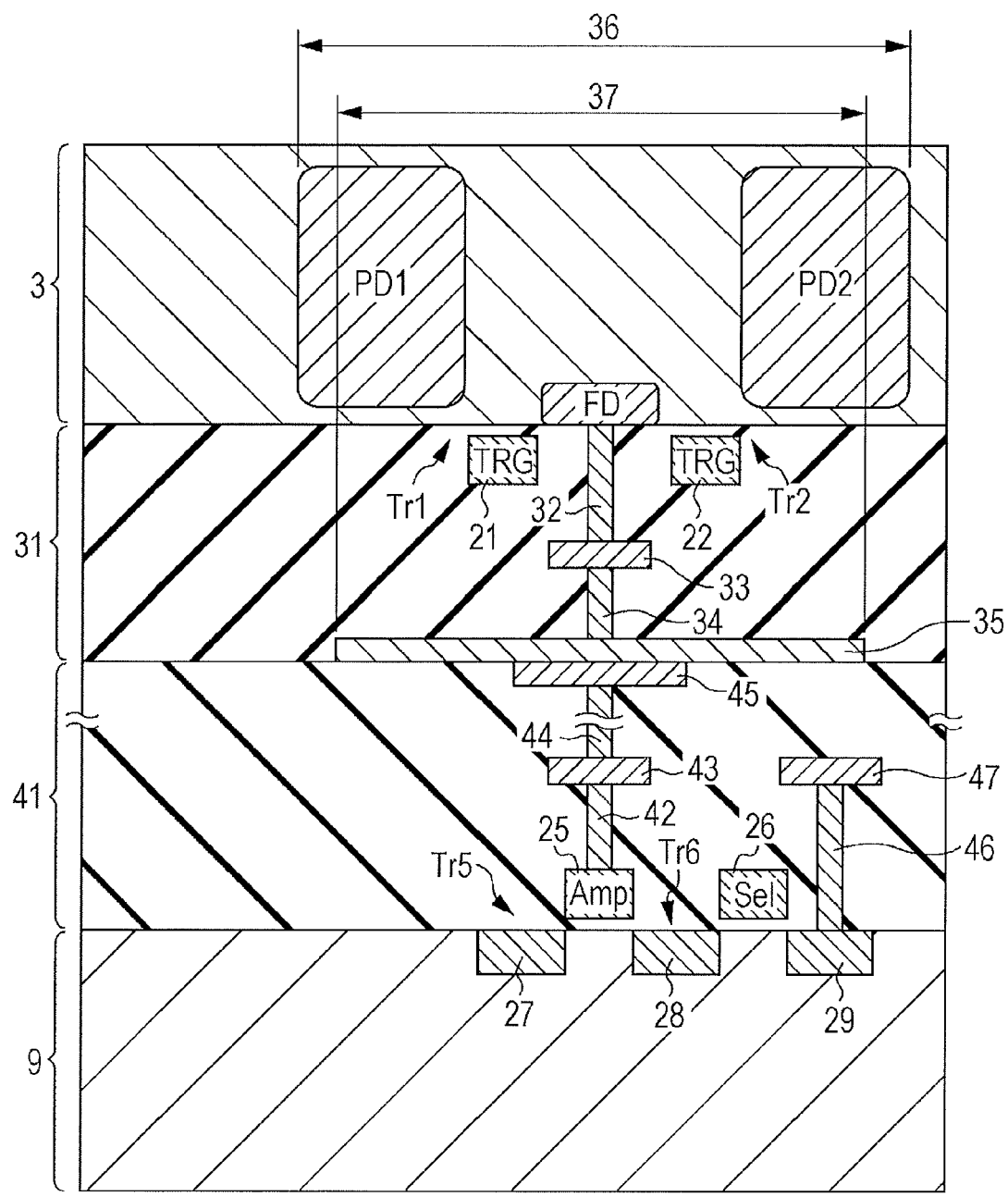
FIG. 3 is a configuration of a line cross-section of the pixel unit shown in FIG. 2.

Next, in FIG. 3, a configuration of a III-III line cross-section of the pixel unit shown in FIG. 2 is shown. As shown in FIG. 3, the solid-state imaging device is obtained in such a manner that a sensor substrate 3 (first semiconductor substrate) and a circuit substrate 9 (second semiconductor substrate) are bonded together so as to respectively face a first wiring layer 31 and a second wiring layer 41. In addition, on a bonding surface of the sensor substrate 3 with the circuit substrate 9, a first electrode 35 formed on a surface of the first wiring layer 31 of the sensor substrate 3 and a second electrode 45 formed on a surface of the second wiring layer 41 of the circuit substrate 9 are joined together.

On the sensor substrate 3, the photodiodes PD1 and PD2, the floating diffusion FD, and the transfer gate electrodes 21 and 22 which are shown in FIG. 2 are formed. In the sensor substrate 3, an upper portion of the drawing is an incident surface of light and a lower portion thereof is a circuit formation surface. The floating diffusion FD and the transfer gate electrodes 21 and 22 are formed on the circuit formation surface side of the sensor substrate 3.

On the circuit formation surface of the sensor substrate 3, the first wiring layer 31 is formed. The first wiring layer 31 has a configuration in which one or more layers of wiring and an insulating layer are laminated. In FIG. 3, a configuration is provided with a single layer or a wiring 33. On the first wiring layer 31, a plug 32 connected to the floating diffusion FD is formed. The plug 32 and the wiring 33 are connected with each other, and the wiring 33 and a plug 34 are further connected with each other.

In addition, on the same layer as the wiring 33, another wiring which is not shown is formed. The wiring formed on the same layer as the wiring 33 is, for example, a power supply wiring or a ground wiring that is connected with the transfer gate electrodes 21 and 22.

On a surface of the first wiring layer 31, the first electrode 35 for connection is formed. The first electrode 35 is connected to the floating diffusion FD through the plugs 32 and 34 and the wiring 33.

On the circuit substrate 9, the control circuit of the pixel unit which is not shown or the logic circuit including the signal processing circuit is mounted. In addition, on the circuit substrate 9, a pixel transistor other than the transfer transistor Tr1 is formed. In FIG. 3, an amplification transistor Tr5 and a selection transistor Tr6 are shown. On a surface of the circuit substrate 9, diffusion regions 27, 28, and 29 which are source/drain of the amplification transistor Tr5 and the selection transistor Tr6 are formed. In addition, an amplification gate electrode 25 and a selection gate electrode 26 are formed on the circuit substrate 9.

On the circuit substrate 9, a second wiring layer 41 is formed. The second wiring layer 41 has a configuration in which a plurality of layers of wiring and an insulating layer are laminated. In FIG. 3, among a plurality of wirings formed on the second wiring layer 41, one layer of wirings 43 and 47 are shown. The wiring 43 is connected to the amplification gate electrode 25 and the second electrode 45 formed on the surface of the second wiring layer 41 by the plugs 42 and 44. Therefore, the second electrode 45 is connected to the amplification gate electrode 25 through the plugs 42 and 44 and the wiring 43. In addition, a plug 46 and a wiring 47 are connected to the diffusion region 29 of the selection transistor Tr6.

In the above-described configuration, the floating diffusion FD provided on the surface of the sensor substrate 3 and the amplification gate electrode 25 provided on the circuit substrate 9 are directly connected with each other by a conductor through the first electrode 35 and the second electrode 45. Consequently, the floating diffusion FD and the amplification gate electrode 25 are connected with each other by a floating diffusion wiring (hereinafter, referred to as "FD wiring") including the first electrode 35, the second electrode 45, the plugs 32, 34, 42, and 44 and the wirings 33 and 43. In this manner, a pixel transistor for processing signals accumulated in the floating diffusion FD of the sensor substrate 3 is formed on the circuit substrate 9.

In the first wiring layer 31, it is preferable that the first electrode 35, the plugs 32 and 34, and the wiring 33 which constitute the FD wiring be formed with a wiring width on a minimum design rule in order to increase conversion efficiency. In addition, it is preferable that the floating diffusion FD and the first electrode 35 be wired so as to be connected with each other at the shortest distance in order to also increase the conversion efficiency. Furthermore, it is preferable that the plugs 32 and 34 and the wiring 33 be so formed as to be apart from another wiring as much as possible so that the plugs 32 and 34 and the wiring 33 are not capacitively coupled to another wiring formed on the first wiring layer 31.

In the same manner, in the second wiring layer 41, it is preferable that the second electrode 45, the plugs 44 and 42, and the wiring 43 which constitute the FD wiring be formed with a wiring width on a minimum design rule in order to increase conversion efficiency. In addition, it is preferable that the amplification gate electrode 25 and the second electrode 45 be formed so as to be connected with each other at the shortest distance in order to increase conversion efficiency. Furthermore, it is preferable that the plugs 44 and 42 and the wiring 43 be so formed as to be apart from another wiring as much as possible so that the plugs 44 and 42 and the wiring 43 are not capacitively coupled to another wiring formed on the second wiring layer 41.

In addition, a reset transistor, which is not shown, may be formed between the pixel sharing units on the sensor substrate 3 side, or formed in another portion of the circuit substrate 9 side. In order to increase an area of the photodiode PD of the sensor substrate 3, it is preferable that each transistor other than the transfer transistor be all formed on the circuit substrate 9 side.

A region 37 in which the first electrode 35 and the second electrode 45 are formed is smaller than an area of a region 36 in which the plurality of photodiodes PD 1 to PD 4 that share the amplification transistor Tr5 are formed. In order to avoid contact with an electrode of another adjacent region, it is necessary that the first electrode 35 and the second electrode 45 are smaller than the region 36 in which the photodiodes PD 1 to PD 4 are formed.

In addition, it is preferable that an area of at least one of the first electrode 35 and the second electrode 45 be formed so as to be larger than an area in which the floating diffusion FD is formed. Further, in FIG. 2 described above, a planar arrangement of the region 37 that forms the first electrode 35 and the second electrode 45 is indicated by a broken line.

It is preferable that the first electrode 35 and the second electrode 45 be provided at a center of the pixel sharing unit. Further, it is preferable that the first electrode 35 and the second electrode 45 be formed in shapes that are point-symmetric or axisymmetric with each other. For example, in the four-pixel sharing unit shown in FIG. 2, it is preferable that a center of the four-pixel sharing unit and a center of the first electrode 35 and the second electrode 45 be formed at the same plane position. In addition, it is preferable that the first electrode 35 and the second electrode 45 be formed in shapes that are point-symmetric or axisymmetric with each other at the center of the pixel sharing unit.

By forming the first electrode 35 and the second electrode 45 in the above-described configuration, in a plurality of pixel sharing units, the FD wirings may be formed at equal intervals, thereby preventing coupling of the FD wirings.

In a semiconductor device having a configuration in which a plurality of substrates are bonded together in the same manner as the present embodiment, there is a problem in positioning accuracy of a bonding surface of the substrates. Therefore, when the substrates are bonded together, there occurs positional displacement in a joining position of the electrodes according to the positioning accuracy of the substrates. In this manner, by connecting failure or conductivity failure due to occurrence of the positional displacement of the joined electrodes, reliability of the semiconductor device may be reduced.

On the other hand, as shown in FIG. 3, the shapes of the first electrode 35 and the second electrode 45 are in the above-described range, and therefore it is possible to ensure connection reliability of the joined electrodes regardless of accuracy of bonding of the substrates. As a result, reliability of the semiconductor device may be improved.

However, when an area of the electrode is increased, the volume of the FD wiring is inevitably increased. As a result, this leads to deterioration of the conversion efficiency of a signal charge. Accordingly, in order to prevent the deterioration of the conversion efficiency, it is preferable that the area of the electrode be minimized as much as possible. In this manner, the area of the first electrode 35 and the second electrode 45 may give adverse effects to the conversion efficiency and the joining reliability. Therefore, it is necessary that the shapes of the first electrode 35 and the second electrode 45 are designed considering positioning accuracy of bonding of the substrate, the conversion efficiency of signals, and the like.

The connection reliability may be ensured even though an area of one electrode is small when an area of the other electrode is large. Therefore, for example, an area of one electrode may be formed so as to be larger than an area in which the floating diffusion DF is formed, and an area of the other electrode may be formed so as to be further smaller. In this case, improvement in characteristics with respect to both the connection reliability of the electrodes and the conversion efficiency of the signals can be expected.

Electrode Shape

A configuration example of each of the first electrode 35 and the second electrode 45 capable of allowing for compatibility between the conversion efficiency of the signals and the joining reliability as described above will be described. In FIGS. 4A to 4E, a configuration of the first electrode 35 and the second electrode 45 is shown.

Each of FIGS. 4A to 4E is a plan view showing the configuration of each of the first electrode 35 and the second electrode 45. In FIGS. 4A to 4E, an arrangement in which the first electrode 35 and the second electrode 45 are viewed from the sensor substrate 3 side is shown, and is shown in such a state that the center positions of the first electrode 35 and the second electrode 45 are shifted.

The first electrode 35 and the second electrode 45 which are shown in FIG. 4A are formed by conductor layers which respectively extend in a different direction and have a rectangular plane. In addition, the first electrode 35 and the second electrode 45 are arranged in directions mutually perpendicular to the extending directions, and arranged in positions to cross each other.

In this manner, since the first electrode 35 and the second electrode 45 cross each other, the first electrode 35 and the second electrode 45 are brought in contact with each other at the crossing position even though positional displacement between the sensor substrate and the circuit substrate occurs at the time of joining. As a result, it is possible to prevent connecting failure or conductivity failure due to occurrence of the positional displacement of the joined electrodes, thereby suppressing a reduction in reliability of the semiconductor device.

In addition, the first electrode 35 and the second electrode 45 are formed in a rectangular shape with a wiring width on, for example, a minimum design rule, and therefore an increase in the volume of the FD wiring may be suppressed. As a result, deterioration of the conversion efficiency may be suppressed.

Accordingly, by adapting the first electrode 35 and the second electrode 45 which have the configuration shown in FIG. 4A, it is possible to allow for compatibility between the conversion efficiency and the joining reliability of the solid-state imaging device.

Figure 4B:
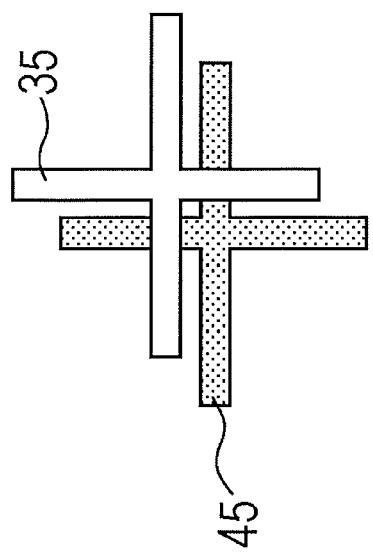
FIG. 4B is a diagram showing a configuration of a first electrode and a second electrode.

In the configuration shown in FIG. 4B, the first electrode 35 and the second electrode 45 are formed from two rectangular conductor layers to cross each other. In addition, the first electrode 35 and the second electrode 45 are joined together in such a manner that the rectangular conductor layers arranged in directions perpendicular to the extending directions to cross each other.

In the configuration shown in FIG. 4B, a contact area is more increased than the above-described configuration shown in FIG. 4A. Therefore, connection reliability is improved. Furthermore, since the contact area is increased, it is possible to ensure the contact area even in a case in which a width of the rectangular conductor layer is smaller than the configuration shown in FIG. 4A. Accordingly, it is possible to suppress an increase in the volume of the FD wiring due to the first electrode 35 and the second electrode 45, and allow for compatibility between the conversion efficiency and the joining reliability.

Figure 4C:
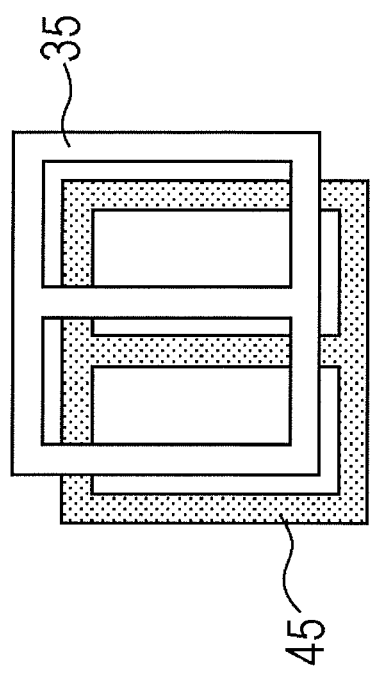
FIG. 4C is a diagram showing a configuration of a first electrode and a second electrode.
Figure 4D:
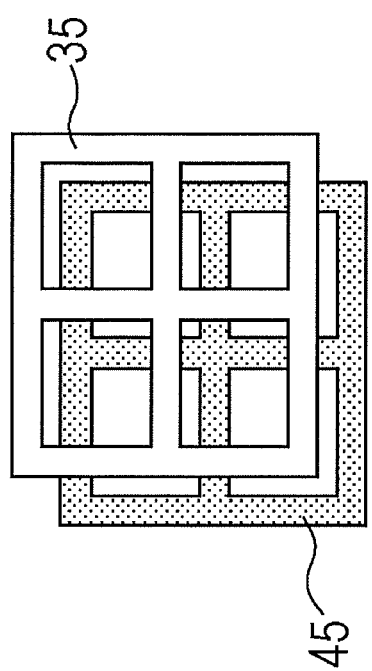
FIG. 4D is a diagram showing a configuration of a first electrode and a second electrode.
Figure 4E:
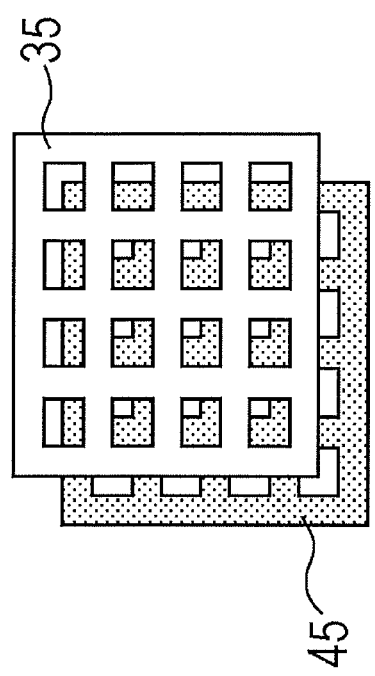
FIG. 4E is a diagram showing a configuration of a first electrode and a second electrode.

In addition, in the configurations shown in FIGS. 4C to 4E, the first electrode 35 and the second electrode 45 are arranged in a lattice shape by combining the rectangular conductor layers. In the configuration shown in FIG. 4C, the first electrode 35 and the second electrode 45 are formed from four rectangular conductor layers arranged in a rectangular form and a single conductor layer arranged within a square form. In addition, in the configuration shown in FIG. 4D, the first electrode 35 and the second electrode 45 are formed from four rectangular conductor layers arranged in a rectangular form and two rectangular conductor layers in a lattice shape within the rectangular form.

In addition, in the configuration shown in FIG. 4E, the first electrode 35 and the second electrode 45 are formed in a mesh shape in which a plurality of rectangular conductor layers are combined.

Along with an increase in the number of the rectangular conductor layers constituting the first electrode 35 and the second electrode 45, a contact area between the first electrode 35 and the second electrode 45 is increased, and the connection reliability is improved. In addition, along with an increase in the number of the rectangular conductor layers constituting the first electrode 35 and the second electrode 45, the volume of the FD wiring is increased, but it is possible to suppress a reduction in the conversion efficiency by sufficiently reducing the volume itself of the rectangular conductor layer. Accordingly, it is possible to allow for compatibility between the conversion efficiency and the joining reliability of the solid-state imaging device.

In addition, in the above-described configuration examples, the first electrode 35 and the second electrode 45 are formed in the rectangular shape, but the shape of the conductor layer constituting the electrode is not limited to the rectangular shape, and the conductor layer may be formed in other shapes. As long as the first electrode 35 and the second electrode 45 are formed with the wiring width on the minimum design rule and extend in mutually different directions, the configuration may be adapted to the solid-state imaging device of the present disclosure.

In the above-described configuration example, the first electrode 35 and the second electrode 45 are formed in the same shape, but may be formed in different shapes. In addition, a size (for example, extending length, width, thickness, and the like) of each of the conductor layers constituting the first electrode 35 and the second electrode 45 and an arrangement interval (pitch) of the conductor layers are appropriately set considering conditions such as the design rule, joining accuracy, and the like.

<Transfer Gate Electrode Wiring, Ground Wiring>

Figure 5:
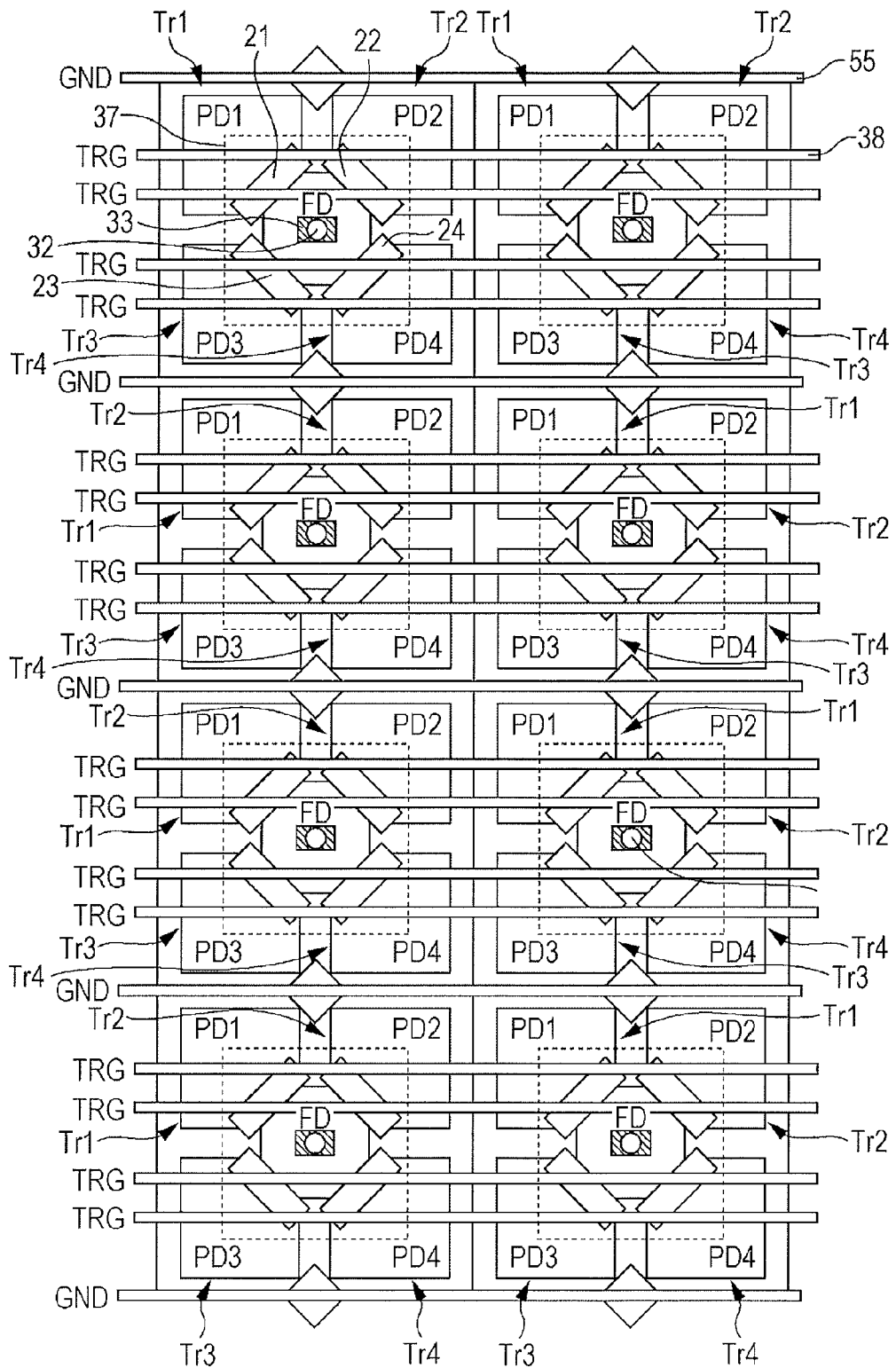
FIG. 5 is a diagram showing a planar arrangement of a GND wiring and a TRG wiring in a four-pixel sharing unit.
Figure 6A:
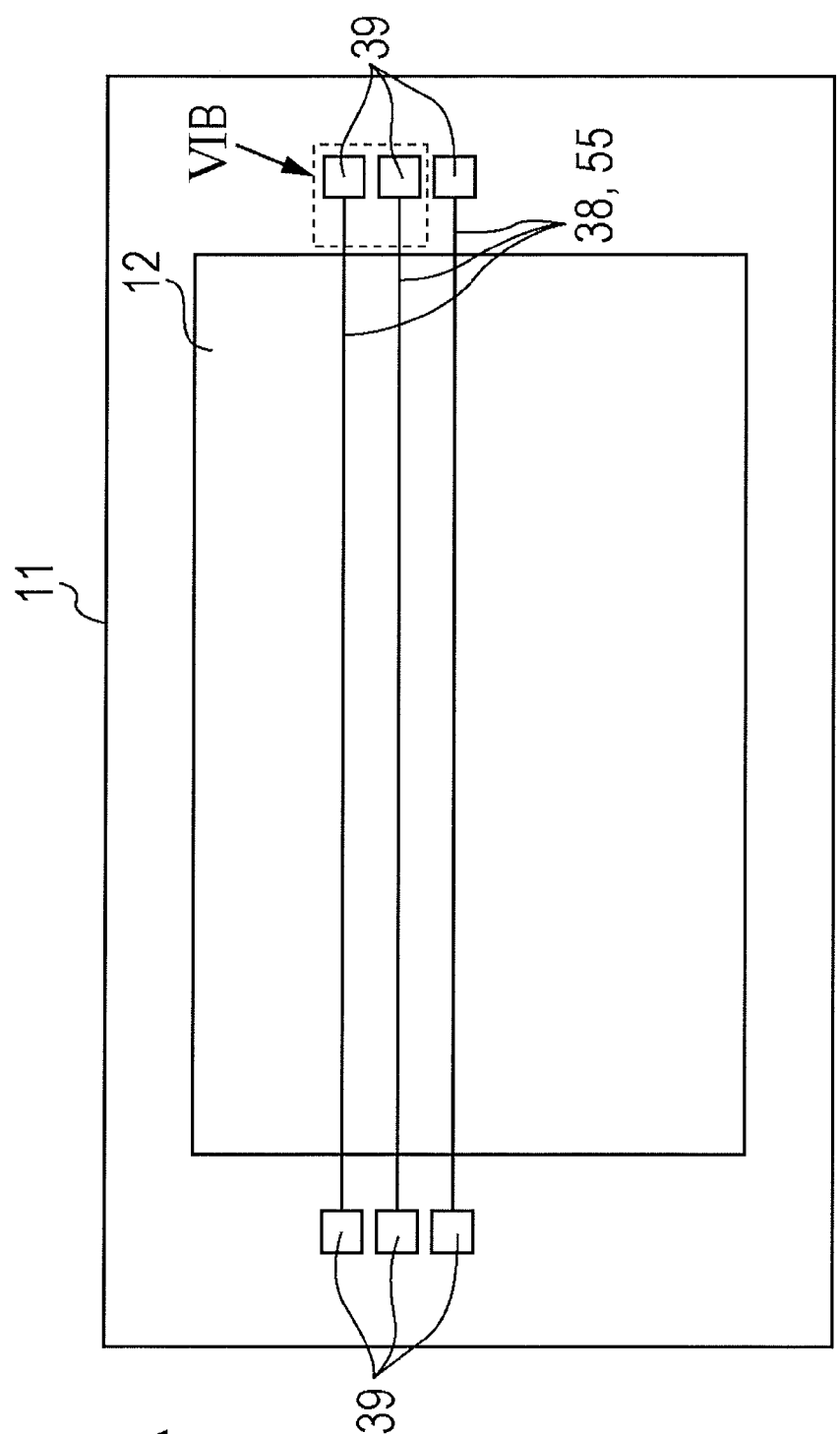
FIG. 6A is a plan diagram of a pixel area in which GND/TRG wirings are formed.
Figure 6B:
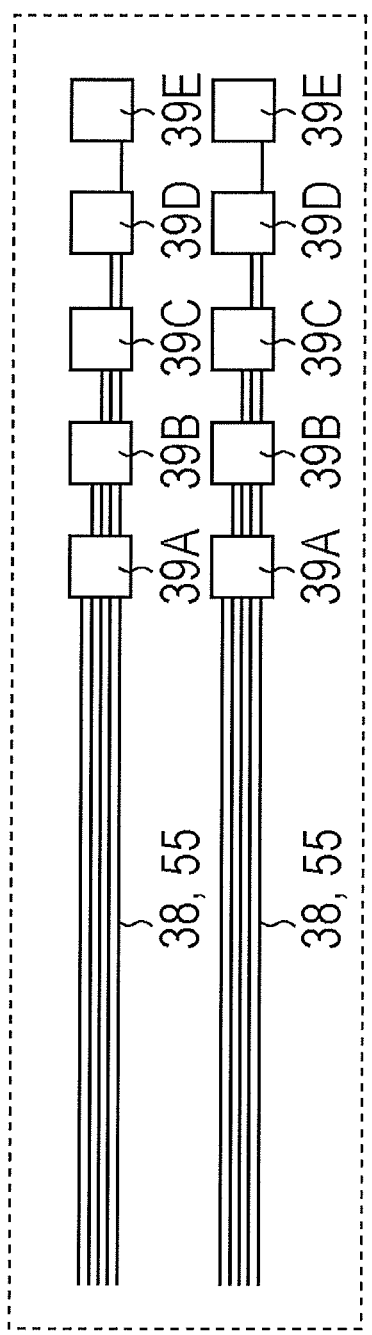
FIG. 6B is an enlarged diagram of a VIB portion shown in FIG. 6A.

Next, a transfer gate electrode (TRG) wiring and a ground (GND) wiring which are formed on the first wiring layer of the sensor substrate will be described. In FIG. 5, a planar arrangement of the GND wiring and the TRG wiring in a four-pixel sharing unit is shown. In addition, in FIG. 6A, a planar arrangement of the GND/TRG wiring in a peripheral area of the pixel area of the sensor substrate is shown. In FIG. 6B, an enlarged diagram of a VIB portion shown in FIG. 6A is shown. In FIG. 6C, a cross-sectional diagram of the GND/TRG wiring of the peripheral area of the pixel area shown in FIG. 6A is shown.

As shown in FIG. 5, in the four-pixel sharing unit, a TRG wiring 38 and a GND wiring 55 are disposed parallel to the horizontal direction in the drawing within the pixel. The TRG wiring 38 is disposed so as to pass over the transfer gate electrodes 21, 22, 23, and 24 on each of the four-pixel sharing unit. In addition, the TRG wiring 38 is connected to any one of the corresponding transfer gate electrodes 21, 22, 23, and 24, respectively. In addition, the TRG wiring 38 is disposed in such a manner that coupling with the above-described FD wiring is uniform as much as possible. Therefore, when the transfer gate electrode 21 is turned on, the boosting capability of each pixel by the FD coupling may be aligned.

The TRG wiring 38 and the GND wiring 55 are joined with a wiring and an electrode on the circuit substrate 9 side and outside the pixel area in which the photodiode PD, the floating diffusion FD, and the transfer transistor Tr are formed. In FIG. 6A, the pixel area 12 in the sensor substrate 3 of the first semiconductor chip unit 11 and an electrode 39 in which the TRG wiring 38 and the GND wiring 55 are connected to a wiring on the circuit substrate 9 side are shown. As shown in FIG. 6A, the TRG wiring 38 and the GND wiring 55 cross the pixel area 12 in the horizontal direction in the drawing, and is connected to the electrode 39 provided in the peripheral area of the pixel area 12.

In the electrode 39, the TRG wiring 38 of the pixel sharing unit and a plurality of electrodes 39A to 39E connected to the GND wiring 55 are provided as shown in FIG. 6B. Each of the electrodes 39A to 39E is connected to the TRG wiring 38 or the GND wiring 55 that crosses over the pixel sharing unit, respectively. In the four-pixel sharing unit of 2*2, it is necessary that a total of five wirings are provided in accordance with four TRG wirings 38 and one GRD wiring 55. In addition, the five electrodes 39A to 39E are desired to correspond to the five wirings.

It is necessary that an area of the electrode 39 is increased taking accuracy of bonding into consideration. In this instance, when a size of the electrode 39 is the same area as first and second electrostatic clamping of the FD wiring within the pixel, it is necessary that the five electrodes 39A to 39E corresponding to the sharing units are arranged in a direction (horizontal direction in the drawing) parallel to the TRG wiring 38 and the GND wiring 55, as shown in FIG. 6B. In addition, for example, in an eight-pixel sharing unit of 2*4, a total of ten wirings are desired in accordance with eight TRG wirings 38 and two GND wirings 55. For this reason, in the same manner as FIG. 6B, it is necessary that ten electrodes 39 corresponding to the sharing units are arranged in a direction (horizontal direction in the drawing) parallel to the TRG wiring 38 and the GND wiring 55.

In addition, since FIG. 6B shows the planar arrangement, it appears that a plurality of wirings are connected to the electrodes 39A to 39D, but non-contact portions with the electrodes are provided in the interlayer insulating layer, and therefore each of the electrodes 39A to 39E is connected with only a single wiring.

In FIG. 6C, a cross-sectional configuration of the electrode 39 and its periphery are shown. As shown in FIG. 6C, the TRG wiring 38 and the GND wiring 55 are connected to a third electrode 39 that is formed on a surface of the first wiring layer 31 of the sensor substrate 3 through the plug 34. In addition, the third electrode 39 is connected to a fourth electrode 49 that is formed on a surface of the second wiring layer 41 of the circuit substrate 9.

The fourth electrode 49 is connected to a circuit element or the like which is formed on the circuit substrate 9 through the plugs 42 and 44 and the wiring 48.

The TRG wiring 38 and the GND wiring 55 are formed on the same layer as the wiring 33 shown in FIG. 3. In an outer peripheral portion of the pixel area 12, the TRG wiring 38 and the GND wiring 55 are connected with the circuit element of the circuit substrate 9 through the third electrode 39 and the fourth electrode 49. In the third electrode 39 and the fourth electrode 49, a plurality of electrodes are disposed in a matrix shape in a periphery of the pixel area 12. The third electrode 39 and the fourth electrode 49 may be formed to have, for example, a size of about 1 to 20 micrometers, and thereby formed at equal intervals of about 1 micrometer from the neighboring electrode.

By preventing the third electrode 39 and the fourth electrode 49 for connection of the TRG wiring 38 and the GND wiring 55 from being formed within the pixel area 12, a degree of design freedom of the first electrode 35 and the second electrode 45 that are connected to the amplification transistor Tr5 from the floating diffusion FD may be improved. Therefore, it is possible to increase the area of each of the first electrode 35 and the second electrode 45 shown in FIG. 3, and to improve connection reliability.

<First Modification Example: Reset Transistor>

Next, a modification example of the above-described solid-state imaging device according to the first embodiment of the present disclosure will be described. As a first modification example, a configuration example in which a reset transistor is provided on the circuit substrate will be described. In addition, in the first modification example, only a configuration of the reset transistor of the circuit substrate and a configuration of a wiring to the reset transistor are different from the first embodiment. Therefore, in the following description, description of the same configuration as the above-described first embodiment will be omitted.

Figure 7:
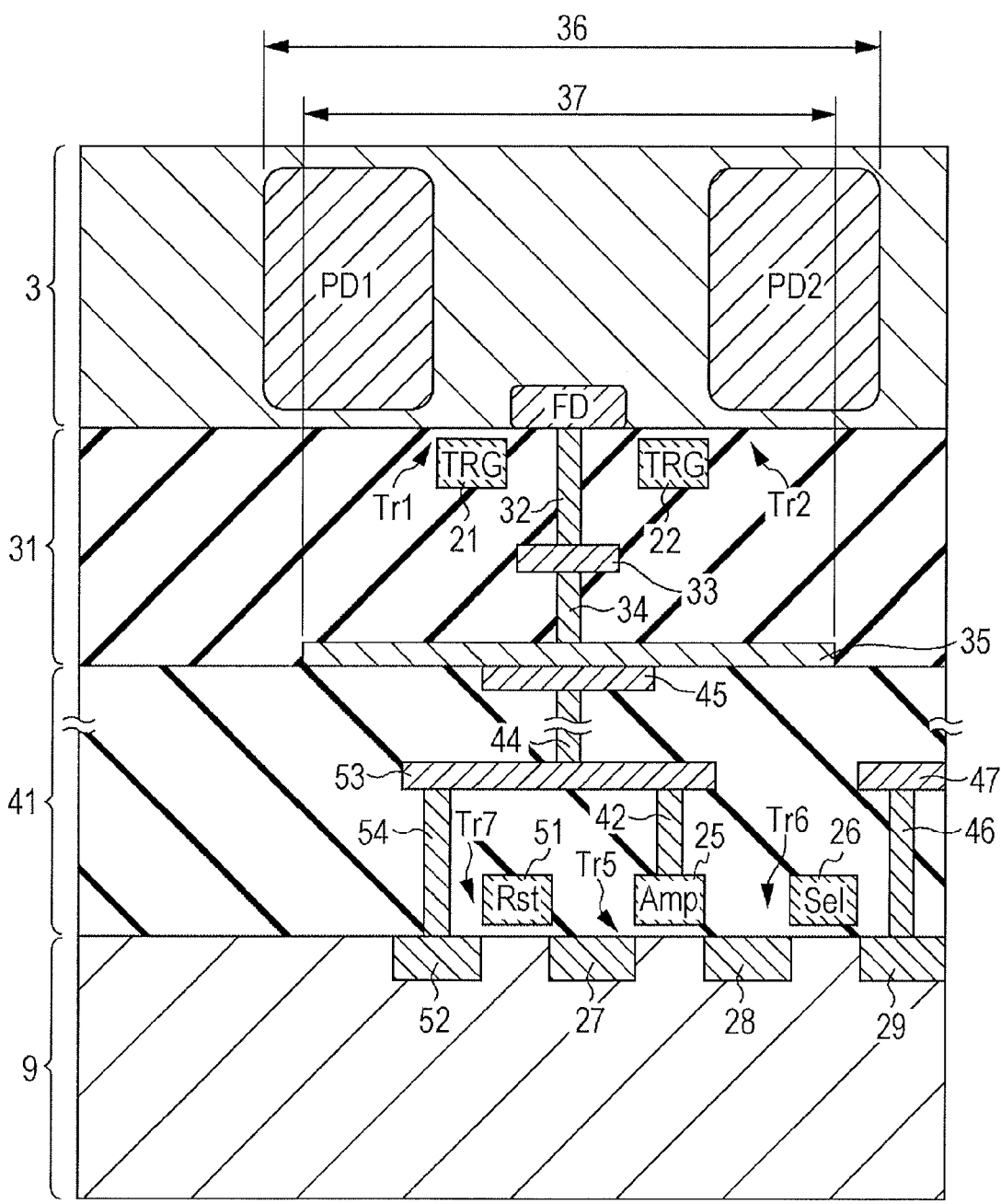
FIG. 7 is a cross-sectional diagram showing a configuration of a first modification example of a solid-state imaging device according to a first embodiment of the present disclosure.

In FIG. 7, a cross-sectional diagram of the solid-state imaging device according to the first modification example is shown. The cross-sectional diagram corresponds to the configuration shown in FIG. 3 in the descriptions of the above-described first embodiment. As shown in FIG. 7, the circuit substrate 9 includes the amplification transistor Tr5, the selection transistor Tr6, and a reset transistor Tr7. On a surface of the circuit substrate 9, the diffusion regions 27, 28, 29, and 52 which are sources/drains of the amplification transistor Tr5, the selection transistor Tr6, and the reset transistor Tr7 are formed. The amplification gate electrode 25, the selection gate electrode 26, and a reset gate electrode 51 are provided on the circuit substrate 9.

On the circuit substrate 9, the second wiring layer 41 is formed. The second electrode 45 is formed on a surface of the second wiring layer 41. The plug 44 connected to the second electrode 45 is connected to a wiring 53. In addition, the wiring 53 is connected to the plugs 42 and 54. The plug 42 is connected to the wiring 53 and the amplification gate electrode 42. In addition, the plug 54 is connected to the wiring 53 and the diffusion region 52 of the reset transistor Tr7.

Therefore, the second electrode 45 is connected to the amplification gate electrode 25 and the diffusion region 52 of the reset transistor Tr7 through the plugs 42, 44, and 54 and the wiring 53. In addition, the floating diffusion FD and the amplification gate electrode 25 are connected with each other by the FD wiring including the first electrode 35, the second electrode 45, the plugs 32, 34, 42, and 44, and the wirings 33 and 53.

In the above-described configuration, the floating diffusion FD provided on a surface of the sensor substrate 3 and a diffusion region 52 of the reset transistor Tr7 provided in the circuit substrate 9 are connected by the plug 54 branched from the FD wiring through the first electrode 35 and the second electrode 45. That is, a configuration that resets a potential of the photodiode PD and the floating diffusion FD of the sensor substrate 3 with the reset transistor Tr7 formed on the circuit substrate 9 is obtained.

Since the reset transistor Tr7 is formed on the circuit substrate 9 side, it is not necessary to form the diffusion region of the reset transistor Tr7 in the sensor substrate 3. For this reason, in the pixel area, it is possible to increase the proportion of a region that forms the photodiode PD. Accordingly, by this structure, improvement in pixel characteristics of the solid-state imaging device such as improvement in sensitivity or saturation signal amount (Qs) is possible.

<Second Modification Example GND Wiring Shield>

Next, a second modification example of the above-described solid-state imaging device according to the first embodiment will be described. The second modification example is a configuration example in which a shield due to a ground wiring is provided in the circuit substrate. In addition, in the following description, description of the same configuration as the above-described first embodiment will be omitted.

Figure 8:
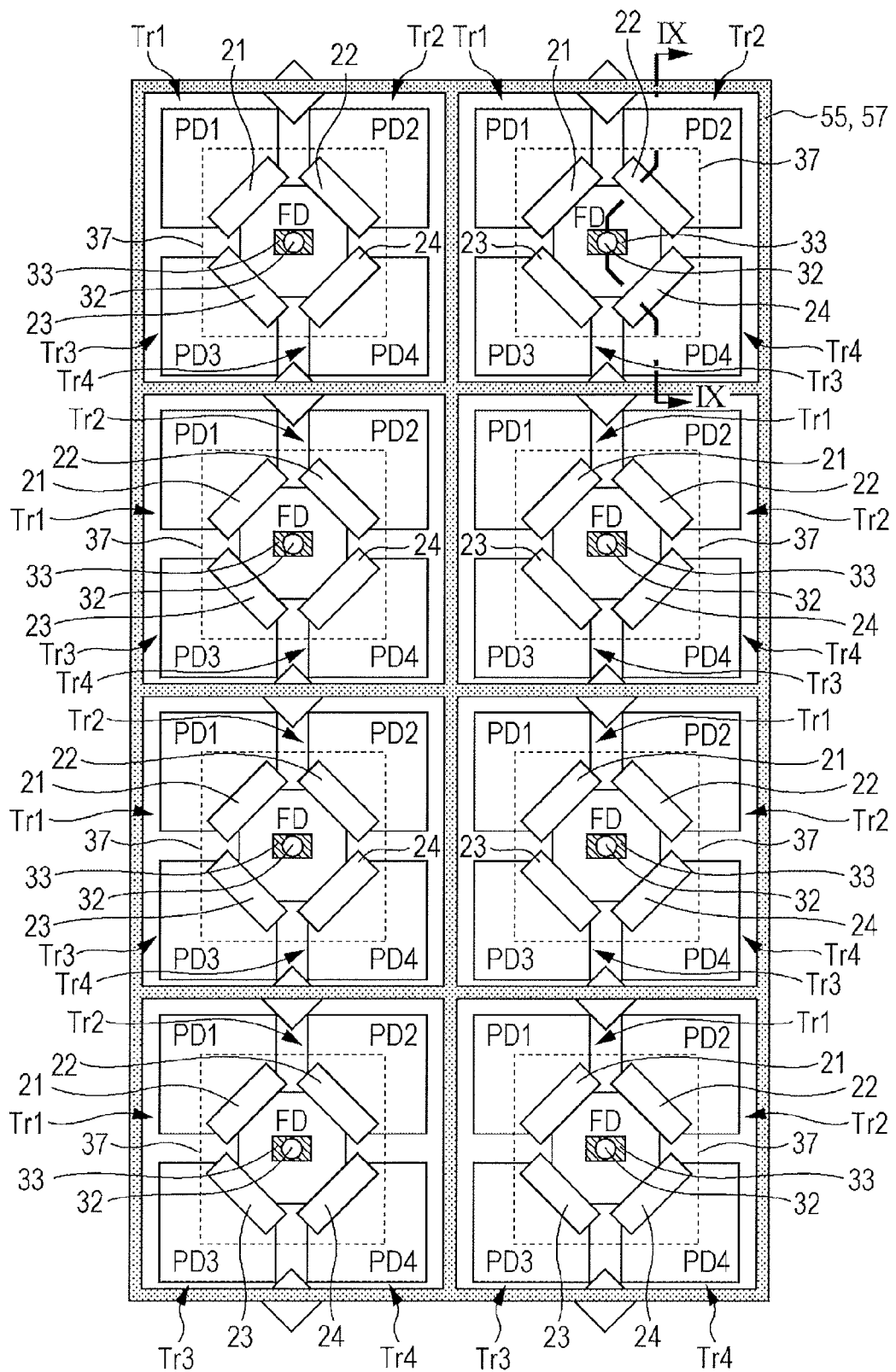
FIG. 8 is a cross-sectional diagram showing a configuration of a second modification example of a solid-state imaging device according to a first embodiment of the present disclosure.

In FIG. 8, a planar diagram of the solid-state imaging device according to the second modification example is shown. In addition, in FIG. 9, a IX-IX line cross-sectional diagram of a pixel unit of FIG. 8 is shown.

Figure 9:
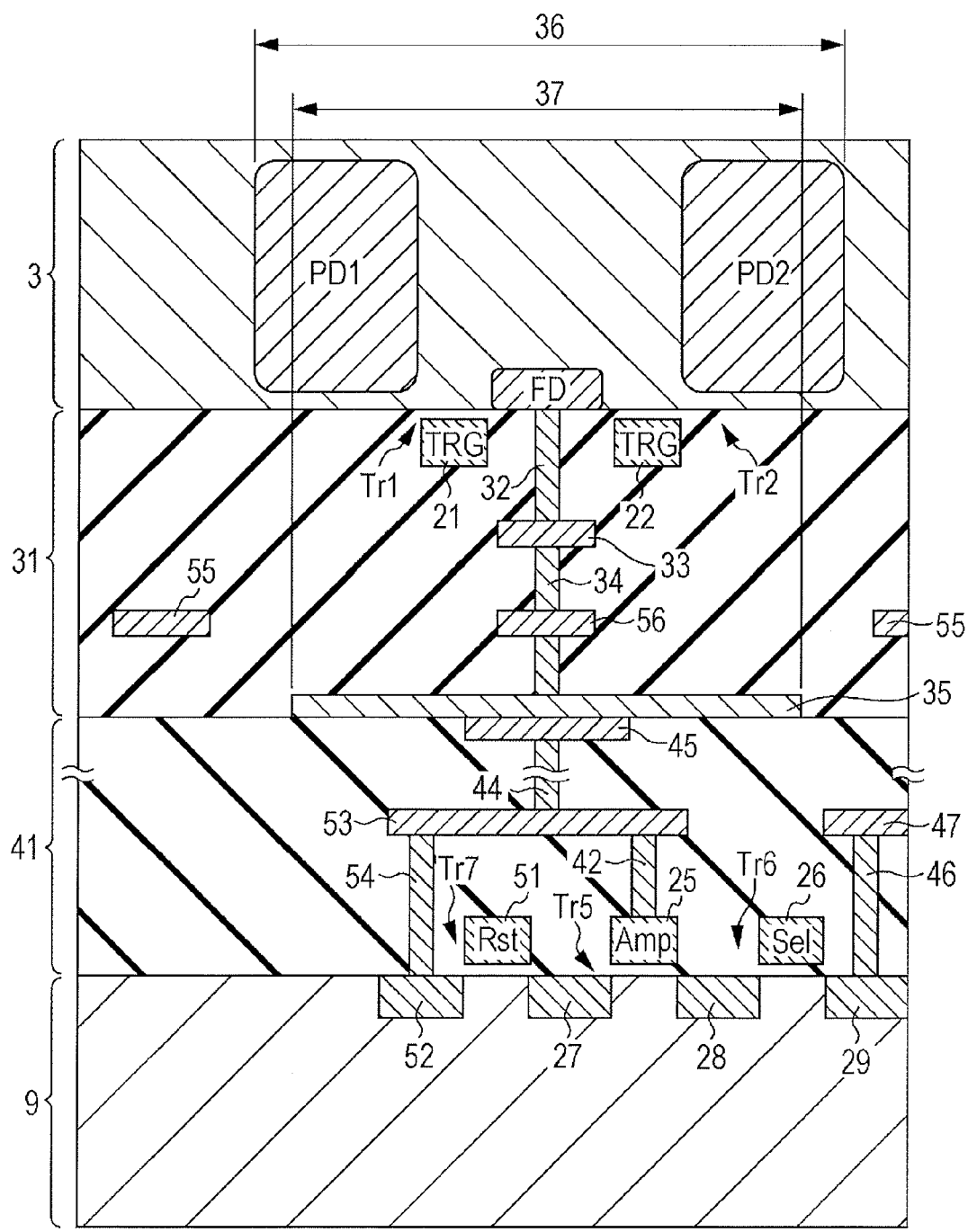
FIG. 9 is a diagram showing a configuration of a IX-IX line cross-section of a pixel unit shown in FIG. 8.

As shown in FIG. 9, the solid-state imaging device according to the present example has a configuration in which the floating diffusion FD is formed in the sensor substrate 3, and signals of the floating diffusion FD are transmitted to the circuit substrate 9 through the FD wiring. In the solid-state imaging device having the above-described configuration, it is preferable that the FD wiring include a shield in order to prevent coupling of the FD wiring from the floating diffusion FD to a source of each of the amplification gate electrode 25 and the reset transistor Tr7.

In the solid-state imaging device according to the present example, the shield of the FD wiring is formed in a ground (GND) wiring 55 formed on the sensor substrate 3 side. As shown in FIG. 8, the GND wiring 55 is disposed in a lattice shape that surrounds a periphery of the four-pixel sharing unit sharing the floating diffusion FD. By surrounding the four-pixel sharing unit by the GND wiring 55, the GND wiring 55 acts as a shield to the FD wiring that is provided at a center of the four-pixel sharing unit. The GND wiring 55 is connected to a ground terminal or the like, which is not shown, so as to be a ground potential.

In addition, in FIG. 9, an example in which two layers of wiring are formed on the first wiring layer 31 of the sensor substrate 3 is shown. In this structure, since the four-pixel sharing unit are surrounded by the GND wiring 55, another wiring such as a TRG wiring or the like may not be formed on the same layer as the GND wiring 55. That is, in the present example, at least two layers of wiring are desired on the first wiring layer 31. In FIG. 9, two layers which are a layer for forming the GND wiring 55 and a layer for forming another wiring such as the TRG wiring or the like are shown. For example, on the same layer as the wiring 33 of the FD wiring, another wiring such as the TRG wiring or the like may be formed. On the same layer as the wiring 56 of the FD wiring, the GND wiring 55 is formed.

<Third Modification Example: VDD Wiring Shield>

Next, a third modification example of the above described solid-state imaging device according to the first embodiment will be described. The third modification example is a configuration example in which a shield due to a VDD wiring is provided in the circuit substrate. In addition, in the following description, description of the same configuration as the above-described first embodiment will be omitted.

In the above-described second modification example, a method of shielding the FD wiring on the sensor substrate 3 side by the GND wiring has been described, but it is possible to shield the FD wiring in the second wiring layer 41 on the circuit substrate 9.

Figure 10:
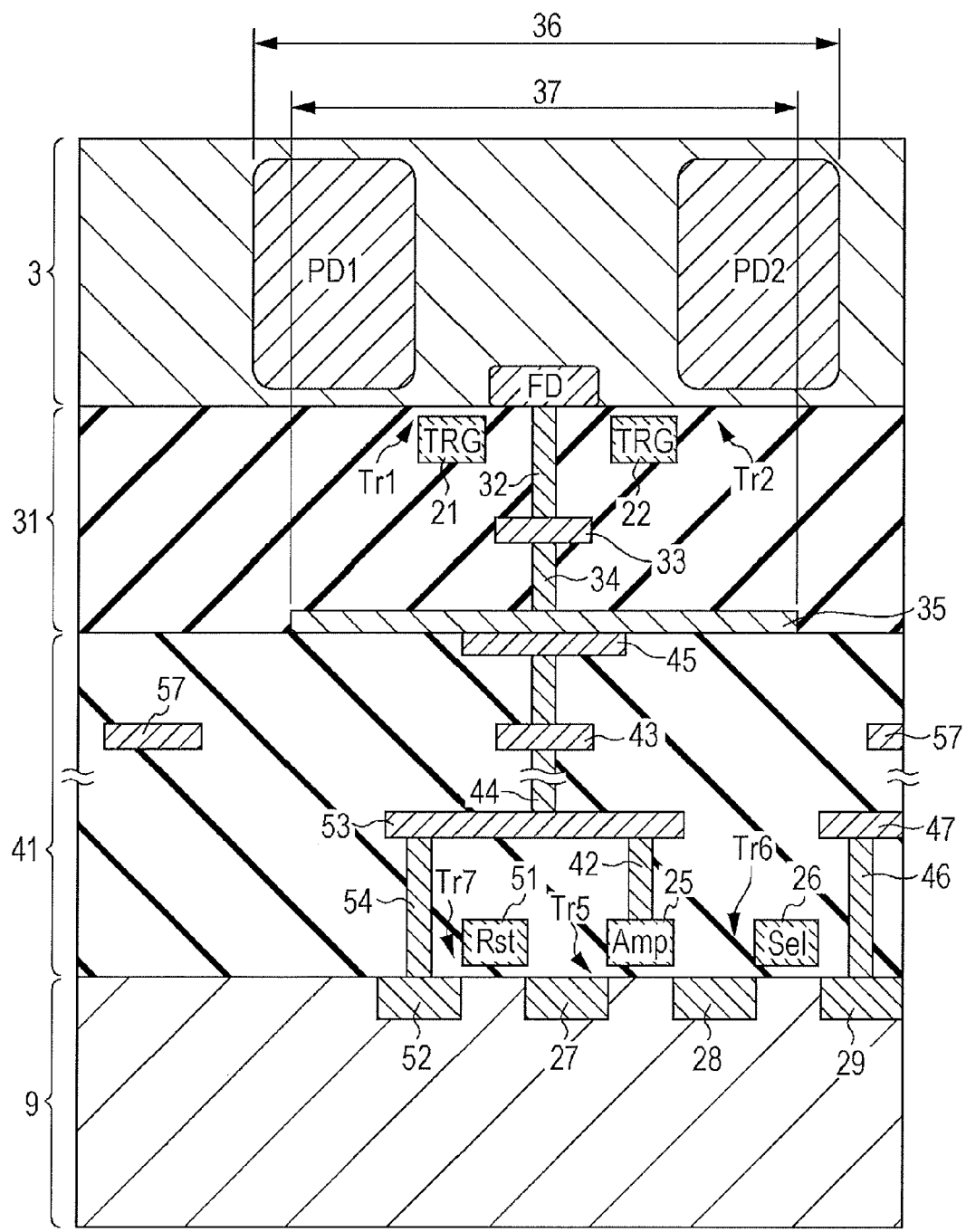
FIG. 10 is a cross-sectional diagram showing a configuration of a third modification example of a solid-state imaging device according to a first embodiment of the present disclosure.

In FIG. 10, a cross-sectional structure of the solid-state imaging device according to the third modification example is shown. In addition, a planar arrangement of the third modification example is the same as the above-described second modification example shown in FIG. 8. For this reason, FIG. 10 corresponds to the X-X line cross-section shown in FIG. 8.

In the third modification example, as a shield of the FD wiring, the shield of the FD wiring is formed in the VDD wiring 57 formed on the circuit substrate 9 side. In FIG. 10, among a plurality of layers of wiring formed on the second wiring layer 41 on the circuit substrate 9, two layers of wiring are shown. The VDD wiring 57 is a wiring connected to a power supply potential.

Since the VDD wiring 57 has a structure of surrounding the four-pixel sharing unit, it is difficult to form the VDD wiring 57 on the same layer as another wiring. Therefore, the VDD wiring 57 is formed on a layer different from the layer on which the wiring 53 connecting the amplification gate electrode 25 and the diffusion region 52 of the reset transistor Tr7 and a wiring 47 connected to the selection transistor Tr6 are formed.

In this manner, by surrounding the four-pixel sharing unit in the VDD wiring 57, the VDD wiring 57 acts as a shield to the ND wiring in which the VDD wiring 57 is provided at a center of the four-pixel sharing unit.

In addition, both a configuration of shielding the FD wiring by the VDD wiring according to the third modification example and a configuration of shielding the FD wiring by the GND wiring according to the above-described second modification example may be used. In addition, as the configuration of shielding the FD wiring, the above-described GND wiring and another wiring other than the VDD wiring may be combined to be used.

<Second Embodiment>
<Eight Pixel Sharing Structure>

Next, a second embodiment of the solid-state imaging device will be described. In the above-described first embodiment, a configuration of the four-pixel sharing unit that share a transistor other than the transfer transistor Tr in four photodiodes PD has been described. In the second embodiment, a configuration of an eight-pixel sharing unit that shares a transistor other than the transfer transistor Tr in eight photodiodes PD will be described. In addition, in the second embodiment, only a pixel sharing structure is different from the first embodiment. Therefore, in the following description, description of the same configuration as the above-described first embodiment will be omitted.

<Planar Arrangement>

Figure 11:
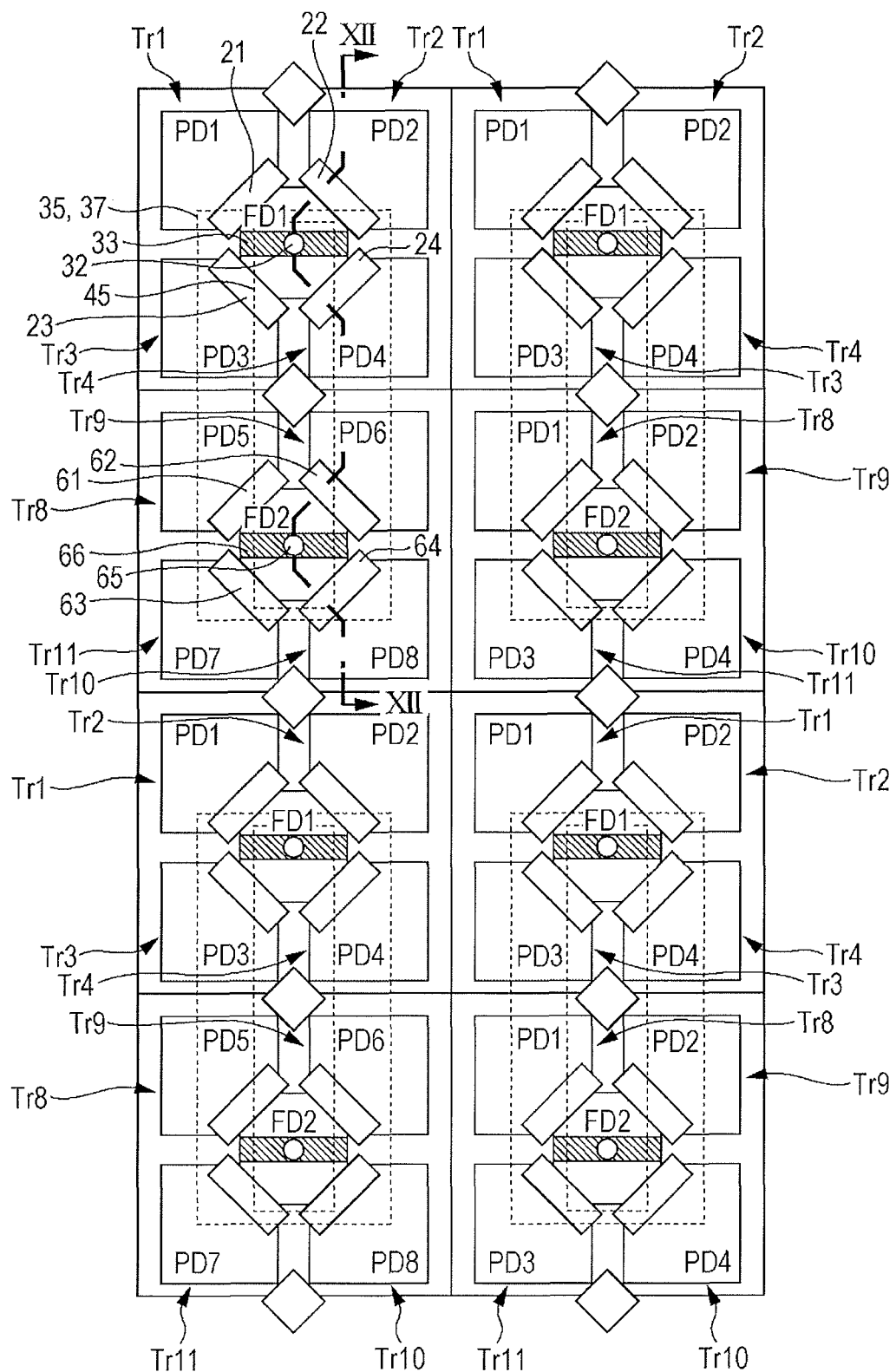
FIG. 11 is a diagram showing a planar arrangement of a pixel unit including an eight-pixel sharing unit of a solid-state imaging device according to a second embodiment of the present disclosure.

In FIG. 11, a planar arrangement of the pixel unit including an eight-pixel sharing unit applied to the present example is shown. As shown in FIG. 11, the pixel unit is configured in such a manner that the eight-pixel sharing unit in which photodiodes PD (PD1 to PD8) of eight pixels are arranged is arranged in a two-dimensional array shape.

In the eight-pixel sharing unit, a total of eight photodiodes PD1 to PD8 of lateral 2*longitudinal 4 are used as a single unit. The eight-pixel sharing unit has a configuration in which a single floating diffusion FD1 is shared with respect to a total of four photodiodes PD1 to PD4 of lateral 2*longitudinal 2. The eight-pixel sharing unit has a configuration in which a single floating diffusion FD2 is shared with respect to a total of four photodiodes PD5 to PD8 of lateral 2 longitudinal 2. The eight-pixel sharing unit has the configuration in which eight transfer gate electrodes 21 to 24 and 61 to 64 with respect to the eight photodiodes PD1 to PD8 and two floating diffusions FD1 and FD2 are provided.

By each of the photodiodes PD1 to PD8, the floating diffusions FD1 and FD2, and each of the transfer gate electrodes 21 to 24 and 61 to 64, the transfer transistors Tr1 to Tr4 and Tr8 to Tr11 are configured. Each of the floating diffusions FD1 and FD2 is disposed at a center portion surrounded by the eight photodiodes PD1 to PD8, and each of the transfer gate electrodes 21 to 24 and 61 to 64 is disposed in a position corresponding to a corner on a center portion side of each of the photodiodes PD1 to PD8.

<Cross-Sectional Structure>

Figure 12:
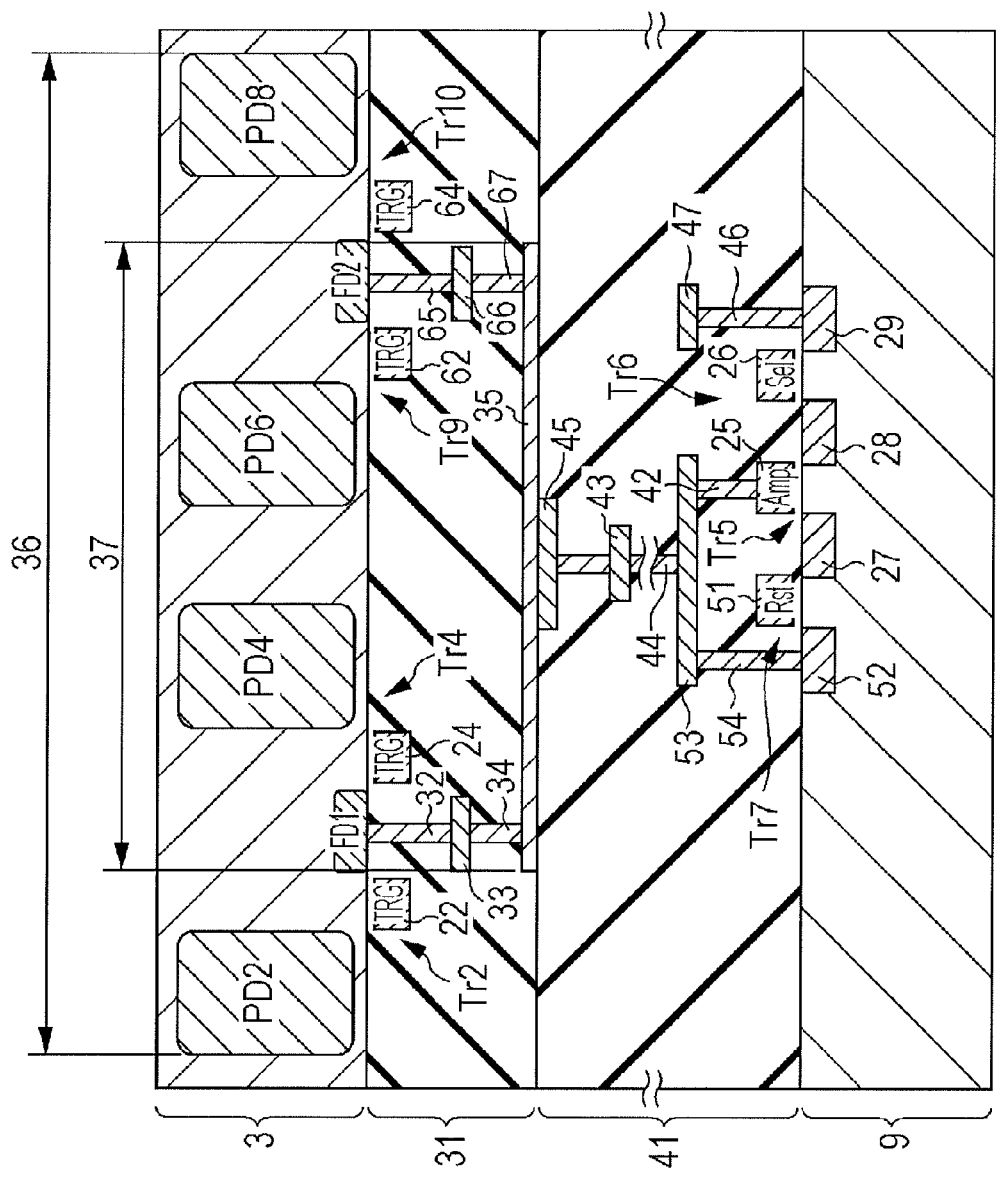
FIG. 12 is a diagram showing a configuration of a XII-XII line cross-section of the pixel unit shown in FIG. 11.

In FIG. 12, a configuration of a XII-XII line cross-section of the pixel unit shown in FIG. 11 is shown. As shown in FIG. 12, in the solid-state imaging device, the sensor substrate 3 and the circuit substrate 9 are bonded together so as to respectively face the first wiring layer 31 and the second wiring layer 41. In addition, on a bonding surface of the circuit substrate 9 with the sensor substrate 3, the first electrode 35 formed on a surface of the first wiring layer 31 of the sensor substrate 3 and the second electrode 45 formed on a surface of the second wiring layer 41 of the circuit substrate 9 are joined together. In addition, a configuration of the circuit substrate 9 side is the same configuration as the above-described first modification example of the first embodiment. Therefore, description of the configuration of the circuit substrate 9 side will be omitted.

On the sensor substrate 3, the above-described photodiodes PD2, 4, 6, and 8 shown in FIG. 11, the floating diffusions FD1 and FD2 and the transfer gate electrodes 22, 24, 62, and 64 are formed. In the sensor substrate 3, an upper portion of the drawing is an incident surface, and a lower portion thereof is a circuit formation surface. The floating diffusions FD1 and FD2 and the transfer gate electrodes 22, 24, 62, and 64 are formed on the circuit formation surface side of the sensor substrate 3.

On the circuit formation surface of the sensor substrate 3, the first wiring layer 31 is formed. The first wiring layer 31 has a configuration in which at least one layer of wiring and an insulating layer are laminated. In FIG. 12, one layer of wirings 33 and 66 are shown.

In addition, on the first wiring layer 31, a plug 32 connected to the floating diffusion FD1 is formed. In addition, the plug 32 and the wiring 33 are connected with each other, and the wiring 33 and the plug 34 are connected with each other. In addition, a plug 65 connected to the floating diffusion FD2 is formed. The plug 65 and the wiring 66 are connected with each other, and the wiring 66 and the plug 67 are connected with each other.

On a surface of the first wiring layer 31, a first connection electrode 35 is formed. The first electrode 35 is connected with the floating diffusion FD1 through the plugs 32 and 34 and the wiring 33. In addition, the first electrode 35 is connected with the floating diffusion FD2 through the plugs 65 and 67 and the wiring 66. The electrode 35 is connected to a transistor such as the amplification gate electrode 25 that is formed on the sensor substrate 3, through the electrode 45 of the circuit substrate 9.

In this manner, the solid-state imaging device according to the present example has a configuration in which eight photodiodes PD1 to PD8 share the transistor formed on the circuit substrate 9, through the floating diffusions FD1 and FD2 and one electrode 35.

The region 37 in which the first electrode 35 and the second electrode 45 are formed is smaller than the region 36 in which a plurality of photodiodes PD1 to PD8 which share the amplification transistor Tr5 are formed. It is necessary that the first electrode 35 and the second electrode 45 is formed to be smaller than the region 36 in which the photodiodes PD1 to PD8 are formed in order to avoid contact with an electrode of the neighboring region. In FIG. 11 described above, a planar arrangement of the region 37 in which the first electrode 35 is formed and the region 45 in which the second electrode 45 is formed are indicated by a dashed line.

In addition, it is preferable that an area of at least one of the first electrode 35 and the second electrode 45 be formed to be larger than an area in which the floating diffusion FD is formed. In the same manner as the above-described first embodiment, it is preferable that the first electrode 35 and the second electrode 45 have a configuration capable of allowing for compatibility between conversion efficiency and joining reliability. For example, it is possible to combine a rectangular conductor layer shown in FIG. 4.

As described above, it is possible to apply the present disclosure to the solid-state imaging device of an eight-pixel sharing unit. Even in this case, the same effect as in the above-described first embodiment may be obtained. In addition, in the second embodiment, the transfer gate electrode wiring and the ground wiring may have the same configuration as that of the above-described first embodiment. In addition, even in the configuration of the second embodiment, it is possible to apply a configuration of a modification example of the first embodiment.

<Third Embodiment>
<Element Isolation>

Next, a third embodiment of the solid-state imaging device will be described. In the third embodiment, the solid-state imaging device that is insulated and isolated for each photodiode PD will be described. In addition, in the third embodiment, description of the same configuration as the above-described first and second embodiments will be omitted.

<Pixel Unit Configuration: Planar Arrangement>

Figure 13:
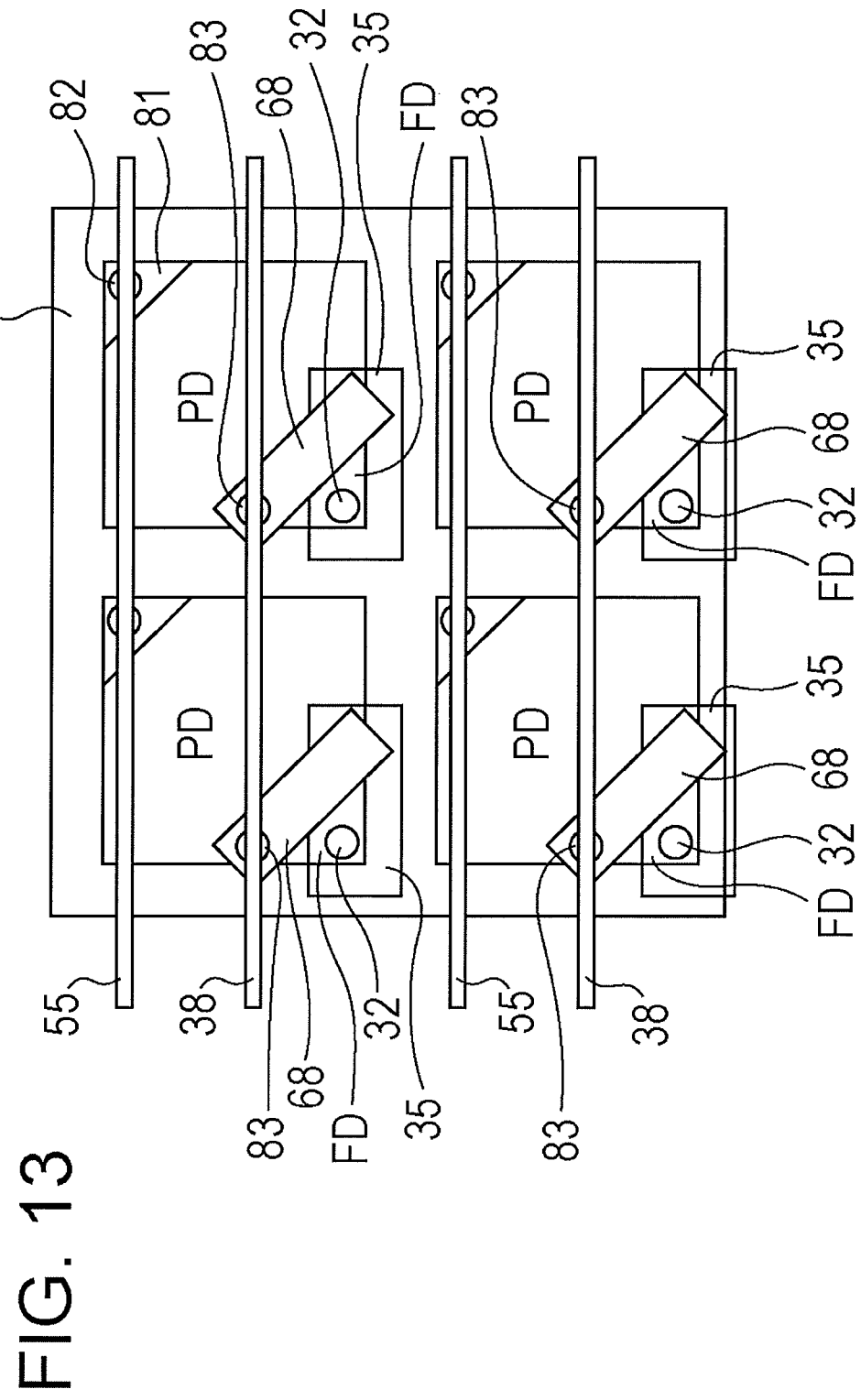
FIG. 13 is a diagram showing a planar arrangement of a pixel unit including a four-pixel sharing unit of a solid-state imaging device according to a third embodiment of the present disclosure.

In FIG. 13, a planar arrangement of the pixel unit of four pixels applied to the present example is shown. As shown in FIG. 13, four photodiodes PD are arranged in a two-dimensional array shape to thereby configure the pixel unit. With respect to each of the photodiodes PD, the transfer gate electrode 68 and the floating diffusion FD are formed. The transfer gate electrode 68 and the floating diffusion FD are provided in a corner of the photodiode PD. In addition, the TRG wiring 38 is connected to the transfer gate electrode 68.

In addition, in the photodiode PD, in a diagonal corner to a corner in which the transfer gate electrode 68 and the floating diffusion FD are provided, a Well 81 is provided. In the Well 81, the GND terminal 82 connected with the GND wiring 55 is provided. The Well 81 and the GND terminal 82 are provided in each of the photodiodes PD.

An element isolation unit 69 is provided between the photodiodes PD. A periphery of the photodiode PD is surrounded by the element isolation unit 69, and each of the photodiodes PD is isolated by the element isolation unit 69. The photodiodes PD are isolated by the element isolation unit 69, thereby preventing color mixing between pixels.

(Pixel Unit Structure: Cross-Sectional Configuration)

Figure 14:
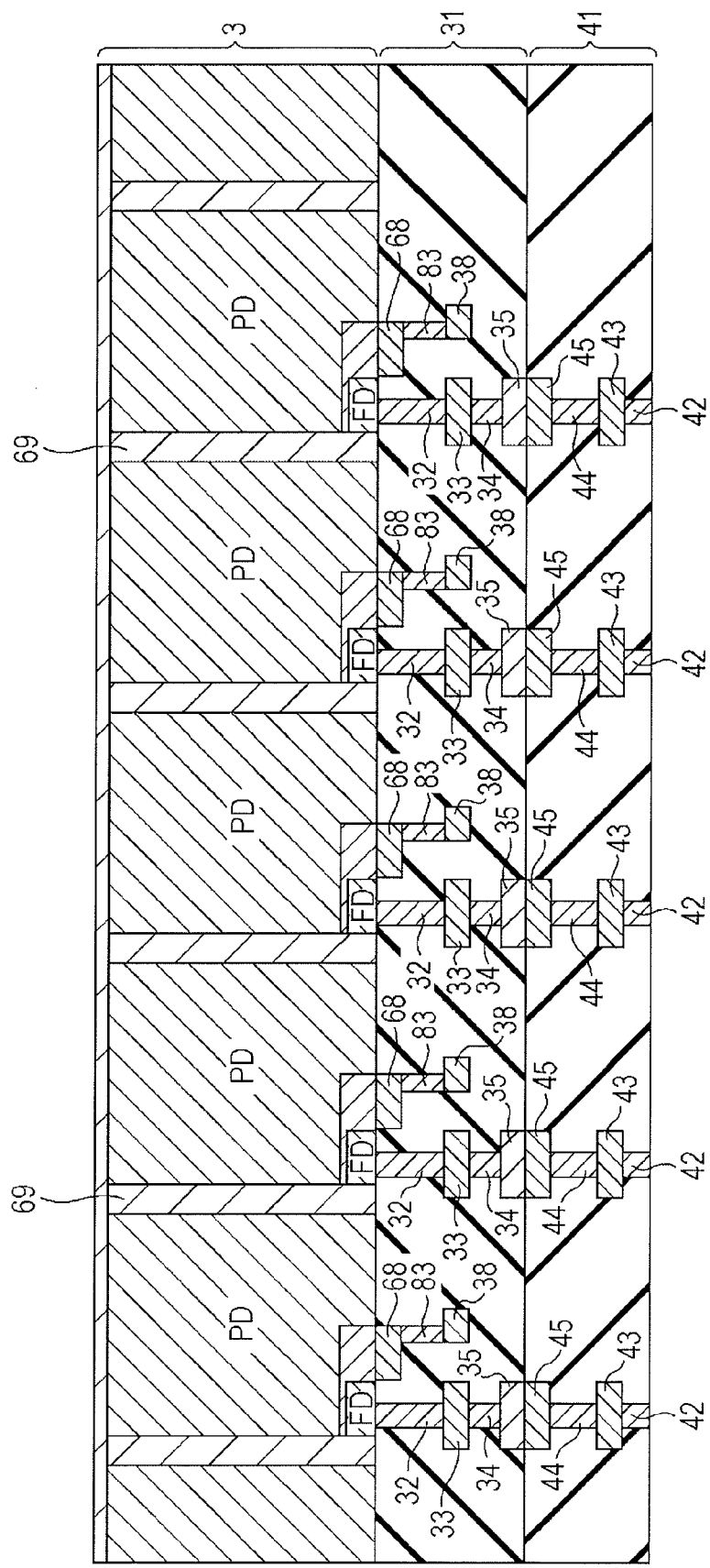
FIG. 14 is a diagram showing a cross-sectional configuration of a solid-state imaging device according to a third embodiment of the present disclosure.

In FIG. 14, a cross-sectional configuration of the solid-state imaging device shown in FIG. 13 is shown. In the solid-state imaging device according to the present example, the sensor substrate 3 and the circuit substrate are bonded with each other so as to respectively face the first wiring layer 31 and the second wiring layer 41. In addition, as shown in FIG. 14, on a bonding surface of the sensor substrate 3 with the circuit substrate, the first electrode 35 formed on a surface of the first wiring layer 31 of the sensor substrate 3 and the second electrode 45 formed on a surface of the second wiring layer 41 of the circuit substrate 9 are joined together. In addition, in FIG. 14, only a configuration of the second wiring layer 41 is shown, and the configuration of the sensor substrate 9 will be omitted. In addition, in FIG. 13, an arranged position of the first electrode 35 is shown. The sensor substrate 9 may have the same configuration as the above-described first and second embodiments.

The photodiode PD of each pixel and the floating diffusion FD are isolated from the photodiode PD of the neighboring pixel and the floating diffusion FD by the element isolation unit 69. In addition, from the floating diffusion FD to a not-shown pixel transistor other than the transfer transistor of the circuit substrate, the FD wiring is configured by each of the plugs 32, 34, 44, and 42 and the wirings 33 and 43.

The TRG wiring 38 is connected to the transfer gate electrode 68 through the plug 83. The TRG wiring is connected to the circuit substrate side, outside the pixel area as shown in FIGS. 6A to 6C described above. In addition, in the present example, in the same manner as the above-described first and second embodiments, the pixel transistor other than the transfer transistor is shared in a plurality of photodiodes PD. For example, in the same manner as the configuration shown in FIG. 12 described above, the plurality of FD wirings are connected by a wiring or an electrode, and therefore the pixel transistor other than the transfer transistor may be shared in the plurality of photodiodes PD and the floating diffusion FD.

<Modification Example Planar Arrangement>

Next, a modification example of the solid-state imaging device according to the third embodiment described above will be described. In the present modification example, a case in which a pixel sharing structure of 2*2 is applied will be described. In addition, in the following description, description of the same configuration as the first to third embodiments will be omitted. In addition, a cross-sectional configuration is the same configuration as FIGS. 12 and 14 described above, and thus repeated description will be omitted.

Figure 15:
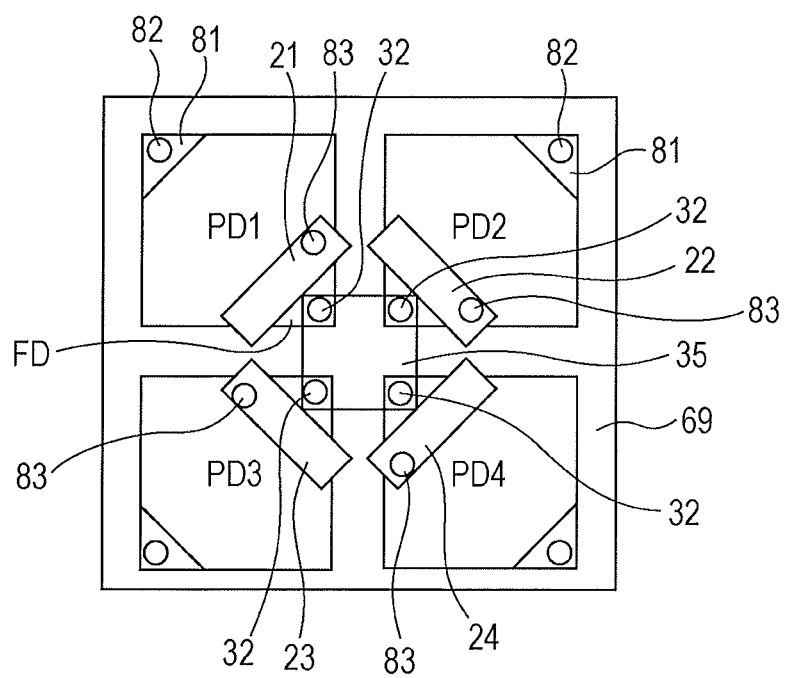
FIG. 15 is a diagram showing a cross-sectional configuration of a solid-state imaging device of a modification example according to a third embodiment of the present disclosure.

In FIG. 15, a planar arrangement diagram of the solid-state imaging device according to the present example is shown. As shown in FIG. 15, a four-pixel sharing unit in which photodiodes PD (PD1 to PD4) of four pixels of lateral 2*longitudinal 2 are arranged is arranged in a two-dimensional array shape to thereby form the pixel unit. The element isolation unit 69 is provided between the photodiodes PD. A periphery of the photodiode PD is surrounded by the element isolation unit 69, and each of the photodiodes PD is isolated by the element isolation unit 69. The photodiodes PD are isolated by the element isolation unit 69, thereby preventing color mixing between the pixels.

In addition, in the photodiode PD, in a diagonal corner to a corner in which the transfer gate electrodes 21 to 24 and the floating diffusion FD are provided, a Well 81 is provided. In the Well 81, a GND terminal 82 which is not shown and connected with the GND wiring is provided. The Well 81 and the GND terminal 82 are provided in each of the photodiodes PD.

With respect to the photodiodes PD1 to PD4, the floating diffusions FD are respectively provided. The floating diffusions FD and the transfer gate electrodes 21 to 24 are arranged in a position corresponding to a corner on a center portion side of each of the photodiodes PD1 to PD4.

The photodiodes PD are connected with each other by the first electrode 35 provided on a surface of the first wiring layer on the sensor substrate. Therefore, a configuration in which the floating diffusion FD connected through a wiring is shared in four photodiodes PD (PD1 to PD4) of four pixels is provided. For example, as a configuration shown in FIG. 12 described above, a plurality of FD electrode wirings are connected to the first electrode 35, and therefore the floating diffusion FD wiring-connected may be shared in four photodiodes PD of 2*2. In addition, in FIG. 15, only an arranged position of the first electrode 35 is shown.

<Fourth Embodiment>
<Electronic Apparatus>

Next, an embodiment of an electronic apparatus including the above-described solid-state imaging device will be described. The above-described solid-state imaging device may be applied to, for example, electronic apparatuses such as a camera system such as a digital camera or a video camera, a mobile phone having an imaging function, or other apparatuses having an imaging function. Hereinafter, a camera as a first configuration example of the electronic apparatus will be described.

Figure 16:
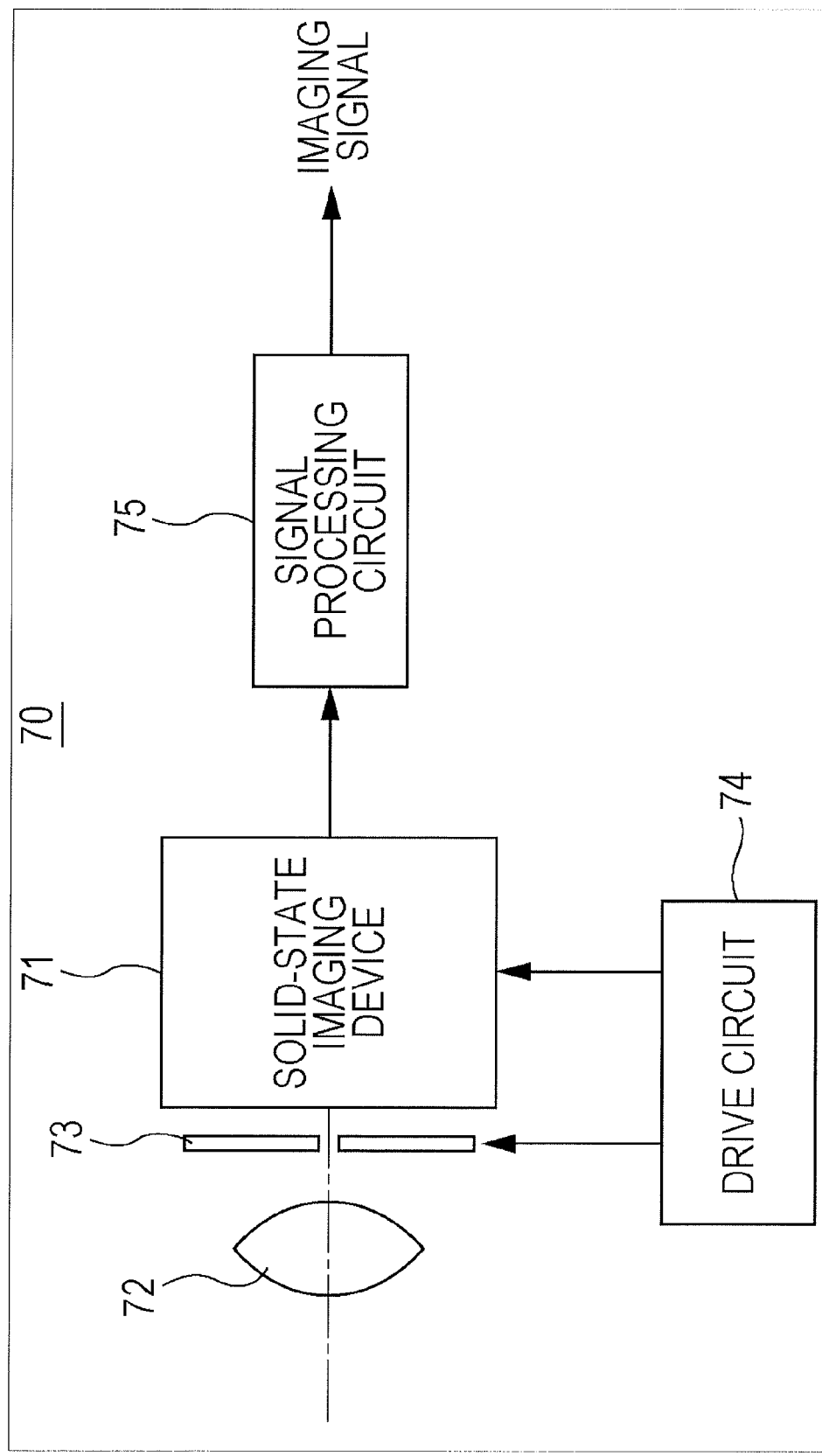
FIG. 16 is a diagram showing a configuration of an electronic apparatus.

In FIG. 16, a configuration example of a video camera capable of imaging still images or video images is shown. The camera 70 of this example includes a solid-state imaging device 71, an optical system 72 that guides incident light to a light receiving sensor unit of the solid-state imaging device 71, a shutter device 73 provided between the solid-state imaging device 71 and the optical system 72, and a drive circuit 74 that drives the solid-state imaging device 71. In addition, the camera 70 includes a signal processing circuit 75 that processes an output signal of the solid-state imaging device 71.

As the solid-state imaging device 71, the above described solid-state imaging device according to each of the embodiments and modification examples may be applied. A configuration and function of each of the other units are as follows.

In the optical system 72, an image beam (incident light) from a subject is formed on an imaging surface (not shown) of the solid-state imaging device 71. Thus, within the solid-state imaging device 71, signal charge is accumulated for a predetermined period of time. In addition, the optical system 72 may be constituted of an optical lens group including a plurality of optical lens. In addition, the shutter device 73 controls a light irradiation period to the solid-state imaging device 71 of the incident light and a shading period.

The drive circuit 74 supplies drive signals to the solid-state imaging device 71 and the shutter device 73. The drive circuit 74 controls a signal output operation to the signal processing circuit 75 of the solid-state imaging device 71 and a shutter operation of the shutter device 73 by the supplied drive signals. That is, in the present example, by the drive signals (timing signals) supplied from the drive circuit 74, a signal transmission operation from the solid-state imaging device 71 to the signal processing circuit 75 is performed.

The signal processing circuit 75 performs a variety of signal processes with respect to the signals transmitted from the solid-state imaging device 71. The signals (image signals) on which the variety of signal processes are performed are stored in a storage medium (not shown) such as a memory. Otherwise, the signals are output to a monitor (not shown).

The present disclosure may have the following configuration.

(1) A solid-state imaging device may comprise a first wiring layer formed on a sensor substrate and a second wiring layer formed on a circuit substrate. The sensor substrate may be coupled to the circuit substrate, the first wiring layer and the second wiring layer being positioned between the sensor substrate and the circuit substrate. A first electrode may be formed on a surface of the first wiring layer, a second electrode may be formed on a surface of the second wiring layer, and the first electrode may be in electrical contact with the second electrode.

(2) A solid-state imaging device according to (1), a floating diffusion region may be formed in the sensor substrate, and a first electrical conductor may connect the floating diffusion region to the first electrode.

(3) A solid-state imaging device according to (1) or (2), a second electrical conductor may connect the second electrode to a gate electrode of an amplification transistor.

(4) A solid-state imaging device according to any one of (1) to (3), a first photodiode and a second photodiode may be formed in the sensor substrate, the first photodiode and the second photodiode sharing an amplification transistor.

(5) A solid-state imaging device according to any one of (1) to (4), a width of a region in which the first electrode and the second electrode may be formed smaller in a direction parallel to a surface of the first wiring layer than a width of a region in which the first photodiode and the second photodiode are formed.

(6) A solid-state imaging device according to any one of (1) to (5), a cross-sectional area of the first electrode may be greater than a cross-sectional area of the first electrical conductor in a plane parallel to a surface of the first wiring layer.

(7) A solid-state imaging device according to any one of (1) to (6), a cross-sectional area of the second electrode may be greater than a cross-sectional area of the second electrical conductor in a plane parallel to a surface of the first wiring layer.

(8) A solid-state imaging device according to any one of (1) to (7), a cross-sectional area of at least one of the first electrode or the second electrode may be greater in a plane parallel to a surface of the first wiring layer than a cross-sectional area of the floating diffusion region.

(9) A solid-state imaging device according to any one of (1) to (8), the first electrode may include a first conductor layer extending in a first direction parallel to a surface of the first wiring layer, and the second electrode may include a second conductor layer extending in a second direction parallel to a surface of the second wiring layer.

(10) A solid-state imaging device according to any one of (1) to (9), the first electrode may be rectangular in shape, the second electrode may be rectangular in shape.

(11) A solid-state imaging device according to any one of (1) to (10), the first direction may be perpendicular to the second direction.

(12) A solid-state imaging device according to any one of (1) to (11), the first electrode may include a first conductor layer portion formed in a first direction parallel to a surface of the first wiring layer and a second conductor layer portion formed in a second direction parallel to the surface of the first wiring layer.

(13) A solid-state imaging device according to any one of (1) to (12), the first conductor layer portion may intersect the second conductor layer portion and the first direction parallel to the surface of the first wiring layer being perpendicular to the second direction parallel to the surface of the first wiring layer.

(14) A solid-state imaging device according to any one of (1) to (13), the second electrode may include a third conductor layer portion formed in a first direction parallel to a surface of the second wiring layer and a fourth conductor layer portion formed in a second direction parallel to the surface of the second wiring layer.

(15) A solid-state imaging device according to any one of (1) to (14), the third conductor layer portion may intersect the fourth conductor layer portion and the first direction parallel to the surface of the second wiring layer being perpendicular to the second direction parallel to the surface of the second wiring layer.

(16) A solid-state imaging device according to any one of (1) to (15), the first conductor layer portion may be parallel to the third conductor layer portion, and the second conductor layer portion may be parallel to the fourth conductor layer portion.

(17) A solid-state imaging device according to any one of (1) to (16), the first electrode may be formed in a first lattice shape. The second electrode may be formed in a second lattice shape. And a center of the first electrode may be offset from a center of the second electrode in a direction parallel to a surface of the first wiring layer.

(18) A solid-state imaging device according to any one of (1) to (17), the first electrode may be formed in a first mesh shape. The second electrode may be formed in a second mesh shape. And a center of the first electrode may be offset from a center of the second electrode in a direction parallel to a surface of the first wiring layer.

(19) A solid-state imaging device may comprise a sensor substrate bonded to a circuit substrate, a first wiring layer being formed on a surface of the sensor substrate and a second wiring layer being formed on a surface of the circuit substrate. The first wiring layer and the second wiring layer may be between the sensor substrate and the circuit substrate. A first contact electrode may be formed on a surface of the first wiring layer opposite from the sensor substrate and a second electrode may be formed on a surface of the second wiring layer opposite from the circuit substrate. And the first electrode may be in electrical contact with the second electrode.

(20) A solid-state imaging device according to (19), the first electrode may include a first conductor layer extending in a first direction parallel to a surface of the first wiring layer.

(21) A solid-state imaging device according to (19) or (20), the second electrode may include a second conductor layer extending in a second direction parallel to a surface of the second wiring layer.

(22) A solid-state imaging device according to any one of (19) to (21), the first electrode may be rectangular in shape. The second electrode may be rectangular in shape. And the first direction may be perpendicular to the second direction.

(23) A solid-state imaging device according to any one of (19) to (22), the first electrode may include a first conductor layer portion formed in a first direction parallel to a surface of the first wiring layer and a second conductor layer portion formed in a second direction parallel to the surface of the first wiring layer. The first conductor layer portion may intersect the second conductor layer portion, and the first direction parallel to the surface of the first wiring layer may be perpendicular to the second direction parallel to the surface of the first wiring layer.

(24) A solid-state imaging device according to any one of (19) to (23), the second electrode may include a third conductor layer portion formed in a first direction parallel to a surface of the second wiring layer and a fourth conductor layer portion formed in a second direction parallel to the surface of the second wiring layer.

(25) A solid-state imaging device according to any one of (19) to (24), the third conductor layer portion may intersect the fourth conductor layer portion, and the first direction parallel to the surface of the second wiring layer may be perpendicular to the second direction parallel to the surface of the second wiring layer.

(26) A solid-state imaging device according to any one of (19) to (25), the first conductor layer portion may be parallel to the third conductor layer portion and the second conductor layer portion may be parallel to the fourth conductor layer portion.

(27) A solid-state imaging device according to any one of (19) to (26), the first electrode may be formed in a first lattice shape. The second electrode may be formed in a second lattice shape. And a center of the first electrode may be offset from a center of the second electrode in a direction parallel to a surface of the first wiring layer.

(28) A solid-state imaging device according to any one of (19) to (27), the first electrode may be formed in a first mesh shape. The second electrode may be formed in a second mesh shape. And a center of the first electrode may be offset from a center of the second electrode in a direction parallel to a surface of the first wiring layer.

(29) A method for making a solid-state imaging device may comprise the steps of forming a first wiring layer on a sensor substrate, forming a second wiring layer on a circuit substrate, forming a first electrode on a surface of the first wiring layer, forming a second electrode on a surface of the second wiring layer, and coupling the sensor substrate to the circuit substrate with the first wiring layer and the second wiring layer being between the sensor substrate and the circuit substrate.

(30) In the method for making a solid-state imaging device according to (29), a floating diffusion region may be formed in the sensor substrate, and a first electrical conductor may be formed to connect the floating diffusion region to the first electrode.

(31) In the method for making a solid-state imaging device according to (29) or (30), a second electrical conductor may be formed to connect the second electrode to a gate electrode of an amplification transistor.

(32) In the method for making a solid-state imaging device according to any one of (29) to (31), a first photodiode and a second photodiode may be formed in the sensor substrate, the first photodiode and the second photodiode sharing an amplification transistor.

(33) In the method for making a solid-state imaging device according to any one of (29) to (32), a width of a region in which the first electrode and the second electrode may be formed to be smaller in a direction parallel to a surface of the first wiring layer than a width of a region in which the first photodiode and the second photodiode are formed.

(34) In the method for making a solid-state imaging device according to any one of (29) to (33), a cross-sectional area of the first electrode may be formed to be greater than a cross-sectional area of the first electrical conductor in a plane parallel to a surface of the first wiring layer.

(35) In the method for making a solid-state imaging device according to any one of (29) to (34), a cross-sectional area of the second electrode may be formed to be greater than a cross-sectional area of the second electrical conductor in a plane parallel to a surface of the first wiring layer.

(36) In the method for making a solid-state imaging device according to any one of (29) to (35), a cross-sectional area of at least one of the first electrode or the second electrode may be formed to be greater in a plane parallel to a surface of the first wiring layer than a cross-sectional area of the floating diffusion region.

(37) In the method for making a solid-state imaging device according to any one of (29) to (36), the first electrode may be formed to include a first conductor layer extending in a first direction parallel to a surface of the first wiring layer. And the second electrode may be formed to include a second conductor layer extending in a second direction parallel to a surface of the second wiring layer.

(38) In the method for making a solid-state imaging device according to any one of (29) to (37), the first electrode may be formed to be rectangular in shape, the second electrode may be formed to be rectangular in shape, and the first direction may be perpendicular to the second direction.

(39) In the method for making a solid-state imaging device according to any one of (29) to (38), the first electrode may be formed to include a first conductor layer portion formed in a first direction parallel to a surface of the first wiring layer and a second conductor layer portion formed in a second direction parallel to the surface of the first wiring layer.

(40) In the method for making a solid-state imaging device according to any one of (29) to (39), the first conductor layer portion may intersect the second conductor layer portion and the first direction parallel to the surface of the first wiring layer may be perpendicular to the second direction parallel to the surface of the first wiring layer.

(41) In the method for making a solid-state imaging device according to any one of (29) to (40), the second electrode may be formed to include a third conductor layer portion formed in a first direction parallel to a surface of the second wiring layer and a fourth conductor layer portion may be formed in a second direction parallel to the surface of the second wiring layer. The third conductor layer portion may intersect the fourth conductor layer portion, and the first direction parallel to the surface of the second wiring layer may be perpendicular to the second direction parallel to the surface of the second wiring layer. And the first conductor layer portion may be formed to be parallel to the third conductor layer portion and the second conductor layer portion may be formed to be parallel to the fourth conductor layer portion.

(42) In the method for making a solid-state imaging device according to any one of (29) to (41), the first electrode may be formed in a first lattice shape. The second electrode may be formed in a second lattice shape. And a center of the first electrode may be formed to be offset from a center of the second electrode in a direction parallel to a surface of the first wiring layer.

(43) In the method for making a solid-state imaging device according to any one of (29) to (42), the first electrode may be formed in a first mesh shape. The second electrode may be formed in a second mesh shape. And a center of the first electrode may be formed to be offset from a center of the second electrode in a direction parallel to a surface of the first wiring layer.

(44) A solid-state imaging device including: a first semiconductor substrate; a second semiconductor substrate;

a photodiode that is formed on the first semiconductor substrate, and in which a second primary surface side of the first semiconductor substrate is a light receiving surface; a floating diffusion that is formed on a surface of a first primary surface of the first semiconductor substrate; a first transistor that is formed on the first primary surface of the first semiconductor substrate; a first wiring layer that is formed on the first primary surface of the first semiconductor substrate; a first electrode that is exposed to a surface of the first wiring layer; a second transistor that is formed on a first primary surface of the second semiconductor substrate;

a second wiring layer that is formed on the first primary surface of the second semiconductor substrate; a second electrode that is exposed to a surface of the second wiring layer; and a floating diffusion wiring that connects the floating diffusion and a gate electrode of the second transistor through the first electrode and the second electrode, wherein the second transistor is shared by a plurality of the photodiodes, and the first electrode and the second electrode are joined together so that the first semiconductor substrate and the second semiconductor substrate are bonded with each other.

(45) In the solid-state imaging device according to (44), the first electrode and the second electrode may be smaller than an area of a region in which the plurality of photodiodes sharing the second transistor are formed.

(46) In the solid-state imaging device according to (44) or (45), an area of at least one of the first electrode and the second electrode may be larger than an area in which the floating diffusion is formed.

(47) In the solid-state imaging device according to any one of (44) to (46), the first electrode and the second electrode are formed by conductor layers that extend in mutually different directions.

(48) In the solid-state imaging device according to any one of (44) to (47), the first electrode and the second electrode may be formed in a lattice shape in which a plurality of conductor layers extending in mutually different directions are combined.

(49) In the solid-state imaging device according to any one of (44) to (48), a third electrode for connecting a first gate electrode wiring connected to a gate electrode of the first transistor and the second semiconductor substrate may be formed on a surface of the first wiring layer around a pixel area in which the photodiode and the floating diffusion are formed.

(50) In the solid-state imaging device according to (49), a plurality of third electrodes may be aligned in a direction parallel to the first gate electrode wiring.

(51) In the solid-state imaging device according to any one of (44) to (49), the floating diffusion wiring may be surrounded by a ground wiring within the first wiring layer.

(52) In the solid-state imaging device according to any one of (44) to (51), the floating diffusion wiring may be surrounded by a VDD wiring within the second wiring layer.

(53) In the solid-state imaging device according to any one of (44) to (52), the first electrode may be shared in a plurality of the floating diffusions.

(54) In the solid-state imaging device according to any one of (44) to (53), an element isolation portion may be formed around the photodiode.

(55) In the solid-state imaging device according to (54), a terminal connected to a ground wiring may be disposed in the photodiode.

(56) An electronic apparatus including: the solid-state imaging device according to any one of (44) to (55) and a signal processing circuit that processes an output signal of the solid-state imaging device.

The present disclosure contains subject matter related to that disclosed in Japanese Priority Patent Application JP 2012-159789 filed in the Japan Patent Office on Jul. 18, 2012, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

REFERENCE SIGNS LIST

3 Sensor substrate
9 Circuit substrate
10, 71 Solid-state imaging device
11 First semiconductor chip unit
12 Pixel area
13 Second semiconductor chip unit
14 Control circuit
15 Logic circuit
21, 22, 23, 24, 61, 62, 63, 64, 68 Transfer gate electrode
25, 42 Amplification gate electrode
26 Selection gate electrode
27, 29, 52 Diffusion region
31, 41 Wiring layer
32, 34, 42, 44, 46, 54, 65, 67 Plug
33, 43, 47, 48, 53, 56, 66 Wiring
35 First electrode
36, 37 Region
38 TRG wiring
39 Third electrode
45 Second electrode
49 Fourth electrode
51 Reset gate electrode
55 GND wiring
57 VDD wiring
69 Element isolation unit
70 Camera
72 Optical system
73 Shutter device
74 Drive circuit
75 Signal processing circuit
81 Well
82 GND terminal
FD1, FD2 Floating diffusion
PD1, PD2, PD3, PD4, PD5, PD6, PD7, PD8 Photodiode
Tr1, Tr2, Tr3, Tr4, Tr8, Tr9, Tr10, Tr11 Transfer transistor
Tr5 Amplification transistor
Tr6 Selection transistor
Tr7 Reset transistor

The invention claimed is:

1. A solid-state imaging device comprising:
a first wiring layer between a sensor substrate and a second wiring layer, the second wiring layer is between a circuit substrate and the first wiring layer;
a channel region of the circuit substrate between a first diffusion region and a second diffusion region, the first diffusion region and the second diffusion region are in the circuit substrate;
a first transfer region of the sensor substrate between a floating diffusion region of the sensor substrate and a first photodiode, the first photodiode touches the first transfer region;
a second transfer region of the sensor substrate between a second photodiode and the floating diffusion region, the second photodiode touches the second transfer region;
a first electrode that touches a second electrode, the first electrode is at a surface of the first wiring layer and the second electrode is at a surface of the second wiring layer;
first electrically-conductive wiring that extends along a straight line from the first electrode to the floating diffusion region, the floating diffusion region touches the first transfer region and the second transfer region;
second electrically-conductive wiring that extends along another straight line from the second electrode to a gate electrode, a portion of the second wiring layer is between the gate electrode and the channel region;
a transfer gate electrode in the first wiring laver, a portion of the first wiring layer is between the first transfer region and the transfer gate electrode; and
a different transfer gate electrode in the first wiring laver, another portion of the first wiring layer is between the second transfer region and the different transfer gate electrode.

2. The solid-state imaging device according to claim 1, wherein in a plan view of the solid-state imaging device, the transfer gate electrode is in parallel with the different transfer gate electrode.

3. The solid-state imaging device according to claim 1, wherein the sensor substrate is bonded to the circuit substrate.

4. The solid-state imaging device according to claim 1, wherein the first wiring layer touches the sensor substrate and the second wiring layer.

5. The solid-state imaging device according to claim 1, wherein the second wiring layer touches the circuit substrate and the first wiring layer.

6. The solid-state imaging device according to claim 1, wherein the channel region touches the first diffusion region and the second diffusion region.

7. The solid-state imaging device according to claim 1, wherein the first electrode is between the floating diffusion region and the gate electrode.

8. The solid-state imaging device according to claim 1, wherein the second electrode is between the floating diffusion region and the gate electrode.

9. The solid-state imaging device according to claim 1, wherein the first electrically-conductive wiring is in the first wiring layer.

10. The solid-state imaging device according to claim 1, wherein the second electrode extends along a direction that is parallel to the surface of the second wiring layer.

11. The solid-state imaging device according to claim 1, wherein the floating diffusion region is between a first photodiode and a second photodiode, the first photodiode and the second photodiode are in the sensor substrate.

12. The solid-state imaging device according to claim 1, wherein the first photodiode is configured to convert incident light into a first signal charge.

13. The solid-state imaging device according to claim 12, wherein the second photodiode is configured to convert the incident light into a second signal charge.

14. The solid-state imaging device according to claim 1, wherein the first electrode is rectangular in shape.

15. The solid-state imaging device according to claim 14, wherein the second electrode is rectangular in shape.

16. The solid-state imaging device according to claim 1, wherein the first electrode has a first lattice shape.

17. The solid-state imaging device according to claim 16, wherein the second electrode has a second lattice shape.

18. The solid-state imaging device according to claim 1, wherein the first electrode has a first mesh shape.

19. The solid-state imaging device according to claim 18, wherein the second electrode has a second mesh shape.

20. The solid-state imaging device according to claim 1, wherein the first photodiode and the second photodiode share a region of the sensor substrate and the first electrode is in a region of the first wiring layer, the region of the first wiring layer is smaller than the region of the sensor substrate in a cross-sectional view of the solid-state imaging device.

21. The solid-state imaging device according to claim 20, wherein the second electrode is in a region of the second wiring layer, the region of the second wiring layer is smaller than the region of the sensor substrate in the cross-sectional view of the solid-state imaging device.

22. The solid-state imaging device according to claim 21, wherein the region of the second wiring layer is smaller than the region of the first wiring layer in the cross-sectional view of the solid-state imaging device.

23. The solid-state imaging device according to claim 1, further comprising:
a different channel region of the circuit substrate between the second diffusion region and a third diffusion region, the third diffusion region is in the circuit substrate.

24. The solid-state imaging device according to claim 23, further comprising:
an electrically conductive plug that extends into the second wiring layer from the third diffusion region.

25. The solid-state imaging device according to claim 23, wherein another portion of the second wiring layer is between another gate electrode and the different channel region.

26. The solid-state imaging device according to claim 1, wherein the first wiring layer is an interlayer insulating layer.

27. The solid-state imaging device according to claim 26, wherein the second wiring layer is another interlayer insulating layer.

28. The solid-state imaging device according to claim 1, wherein the sensor substrate is a semiconductor substrate.

29. The solid-state imaging device according to claim 28, wherein the circuit substrate is another semiconductor substrate.

30. The solid-state imaging device according to claim 1, wherein the first electrode extends along a direction that is parallel to the surface of the first wiring layer.

31. The solid-state imaging device according to claim 30, wherein the second electrode extends along a different direction.

* * * * *